United States Patent
Fung et al.

(10) Patent No.: US 7,207,020 B1
(45) Date of Patent: Apr. 17, 2007

(54) METHOD AND APPARATUS FOR UTILIZING LONG-PATH AND SHORT-PATH TIMING CONSTRAINTS IN AN ELECTRONIC-DESIGN-AUTOMATION TOOL

(75) Inventors: Ryan Fung, Mississauga (CA); Vaughn Betz, Toronto (CA); William Chow, North York (CA)

(73) Assignee: Altera Corporation, San Jose, CA (US)

( * ) Notice: Subject to any disclaimer, the term of this patent is extended or adjusted under 35 U.S.C. 154(b) by 320 days.

(21) Appl. No.: 10/774,883

(22) Filed: Feb. 9, 2004

(51) Int. Cl.
*G06F 17/50* (2006.01)

(52) U.S. Cl. .................. 716/6; 716/9; 716/10; 716/16; 716/18

(58) Field of Classification Search .............. 716/6, 716/9, 10, 16, 18
See application file for complete search history.

(56) References Cited

U.S. PATENT DOCUMENTS

| | | | | |
|---|---|---|---|---|
| 5,237,514 | A * | 8/1993 | Curtin | 716/10 |
| 5,475,607 | A * | 12/1995 | Apte et al. | 716/10 |
| 5,521,837 | A * | 5/1996 | Frankle et al. | 716/10 |
| 5,541,849 | A * | 7/1996 | Rostoker et al. | 716/16 |
| 5,659,484 | A * | 8/1997 | Bennett et al. | 716/16 |
| 5,987,086 | A * | 11/1999 | Raman et al. | 716/1 |
| 6,006,024 | A * | 12/1999 | Guruswamy et al. | 716/12 |
| 6,286,128 | B1 * | 9/2001 | Pileggi et al. | 716/18 |
| 6,324,678 | B1 * | 11/2001 | Dangelo et al. | 716/18 |
| 6,408,427 | B1 * | 6/2002 | Cong et al. | 716/13 |
| 6,453,446 | B1 * | 9/2002 | van Ginneken | 716/3 |
| 6,480,991 | B1 * | 11/2002 | Cho et al. | 716/8 |
| 6,557,145 | B2 * | 4/2003 | Boyle et al. | 716/2 |
| 6,591,411 | B2 * | 7/2003 | Alpert et al. | 716/13 |
| 6,708,139 | B2 * | 3/2004 | Rearick et al. | 702/185 |
| 6,763,506 | B1 * | 7/2004 | Betz et al. | 716/6 |
| 6,826,733 | B2 * | 11/2004 | Hathaway et al. | 716/2 |
| 6,836,753 | B1 * | 12/2004 | Silve | 703/2 |
| 6,904,585 | B2 * | 6/2005 | Brittain et al. | 716/13 |
| 6,996,512 | B2 * | 2/2006 | Alpert et al. | 703/14 |
| 7,000,206 | B2 * | 2/2006 | Kidd et al. | 716/6 |
| 7,003,747 | B2 * | 2/2006 | Zhou et al. | 716/6 |
| 7,003,754 | B2 * | 2/2006 | Teig et al. | 716/14 |
| 7,013,450 | B2 * | 3/2006 | Teig et al. | 716/13 |
| 7,073,150 | B2 * | 7/2006 | Teig et al. | 716/12 |
| 7,133,819 | B1 * | 11/2006 | Hutton | 703/19 |
| 2001/0010090 | A1 * | 7/2001 | Boyle et al. | 716/2 |
| 2002/0116685 | A1 * | 8/2002 | van Ginneken | 716/1 |
| 2002/0133799 | A1 * | 9/2002 | Alpert et al. | 716/13 |
| 2002/0161947 | A1 * | 10/2002 | Ikeda et al. | 710/38 |
| 2003/0005398 | A1 * | 1/2003 | Cho et al. | 716/8 |
| 2003/0115566 | A1 * | 6/2003 | Teig | 716/14 |

(Continued)

OTHER PUBLICATIONS

NN9107410, "Linear Algorithm for Distributing Slack So That All Nets of A Design Have a Zero Slack Pin", IBM Technical Disclosure Bulletin, vol. 34, No. 2, Jul. 1991, pp. 410-414 (7 pages).*

(Continued)

*Primary Examiner*—Phallaka Kik
(74) *Attorney, Agent, or Firm*—L. Cho

(57) ABSTRACT

A method for designing a system includes generating minimum and maximum delay budgets for connections from long-path and short-path timing constraints. The system is designed in response to the minimum and maximum delay budgets.

49 Claims, 18 Drawing Sheets

U.S. PATENT DOCUMENTS

| | | | |
|---|---|---|---|
| 2003/0149954 A1* | 8/2003 | McElvain et al. | 716/18 |
| 2004/0123261 A1* | 6/2004 | Alpert et al. | 716/13 |
| 2004/0243964 A1* | 12/2004 | McElvain et al. | 716/12 |
| 2005/0034091 A1* | 2/2005 | Harn | 716/6 |
| 2005/0039156 A1* | 2/2005 | Catthoor et al. | 716/18 |
| 2005/0050497 A1* | 3/2005 | Tetelbaum | 716/6 |
| 2005/0120319 A1* | 6/2005 | van Ginneken | 716/6 |
| 2005/0132318 A1* | 6/2005 | Kidd et al. | 716/12 |
| 2005/0138578 A1* | 6/2005 | Alpert et al. | 716/2 |
| 2005/0251775 A1* | 11/2005 | Wood | 716/10 |
| 2006/0048086 A1* | 3/2006 | Pie et al. | 716/6 |
| 2006/0150127 A1* | 7/2006 | Zhou et al. | 716/2 |

OTHER PUBLICATIONS

Mathur et al., "Timing-Driven Placement for Regular Architectures", IEEE Transactions on Computer-Aided Design of Integrated Circuits and Systems, vol. 16, No. 6, Jun. 1997, pp. 597-608.*

* cited by examiner

METHOD AND APPARATUS FOR
UTILIZING LONG-PATH AND SHORT-PATH
TIMING CONSTRAINTS IN AN
ELECTRONIC-DESIGN-AUTOMATION
TOOL

FIELD OF THE INVENTION

The present invention relates to electronic design automation (EDA) tools. More specifically, the present invention relates to a method and apparatus for utilizing long-path and short-path timing constraints in an EDA tool.

BACKGROUND

Electronic designs may be large systems that include millions of gates and megabits of embedded memory. Of the tasks required in managing and optimizing electronic designs, synthesis, placement, and routing utilizing available resources can be among the most challenging and time consuming. The complexity of large systems often requires the use of electronic design automation (EDA) tools to manage and optimize designs. EDA tools perform the time-consuming tasks of synthesis, placement, and routing.

Some EDA tools allow users to specify long-path timing constraints such as, for example, FMAX (maximum clocking frequency), TSU (setup time), and TCO (clock-to-output time), in order for designs to meet performance targets. However, many of these EDA tools do not take into account short-path timing constraints.

One vehicle for the implementation of semiconductor designs is to use programmable logic devices (PLDs). PLDs are structured semiconductor devices that include programmable logic, programmable routing, embedded memory, etc. Through appropriate programming, PLDs can be used to implement a variety of logic designs.

At the periphery of a PLD, there are board-level long-path and short-path timing constraints that must be satisfied. Historically, since EDA tools do not take into account short-path timing constraints, users had to manually repair the technology mapping, placement, and routing of the design, or redesign the entire system to satisfy these board-level timing constraints.

Also, PLDs typically provide a number of dedicated clock networks which facilitate operation on a device without encountering internal hold-time violations (violations between registers in the PLD). However, with larger designs where a sufficient number of dedicated clock networks are not available on a PLD, a design may require that clocks be routed locally. In these instances, if a hold-time violation occurred, the user had to manually repair the technology mapping, placement or routing of the design or redesign the entire system. This could be both difficult and time consuming.

Thus, what is needed is an EDA tool that is able to perform the tasks of technology mapping, placement and routing in response to long-path and short-path timing constraints.

SUMMARY

According to an embodiment of the present invention, both long-path and short-path timing constraints are considered for paths in a design. A path may be defined as a series of connections. A long-path timing constraint indicates that the delay from one end of the path to the other end of the path must be no larger than X. A short-path timing constraint indicates that the delay from one end of the path to the other end must be no smaller than Y. The path-level timing constraints are translated into connection-level constraints (minimum and maximum delay budgets). Minimum and maximum delay budgets for each connection are determined which may be used to guide technology mapping, placement, and routing on a PLD such that performance goals are satisfied. A minimum delay budget indicates that the delay of the respective connection should be no smaller than X. A maximum delay budget indicates the delay of the respective connection should be no larger than Y.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
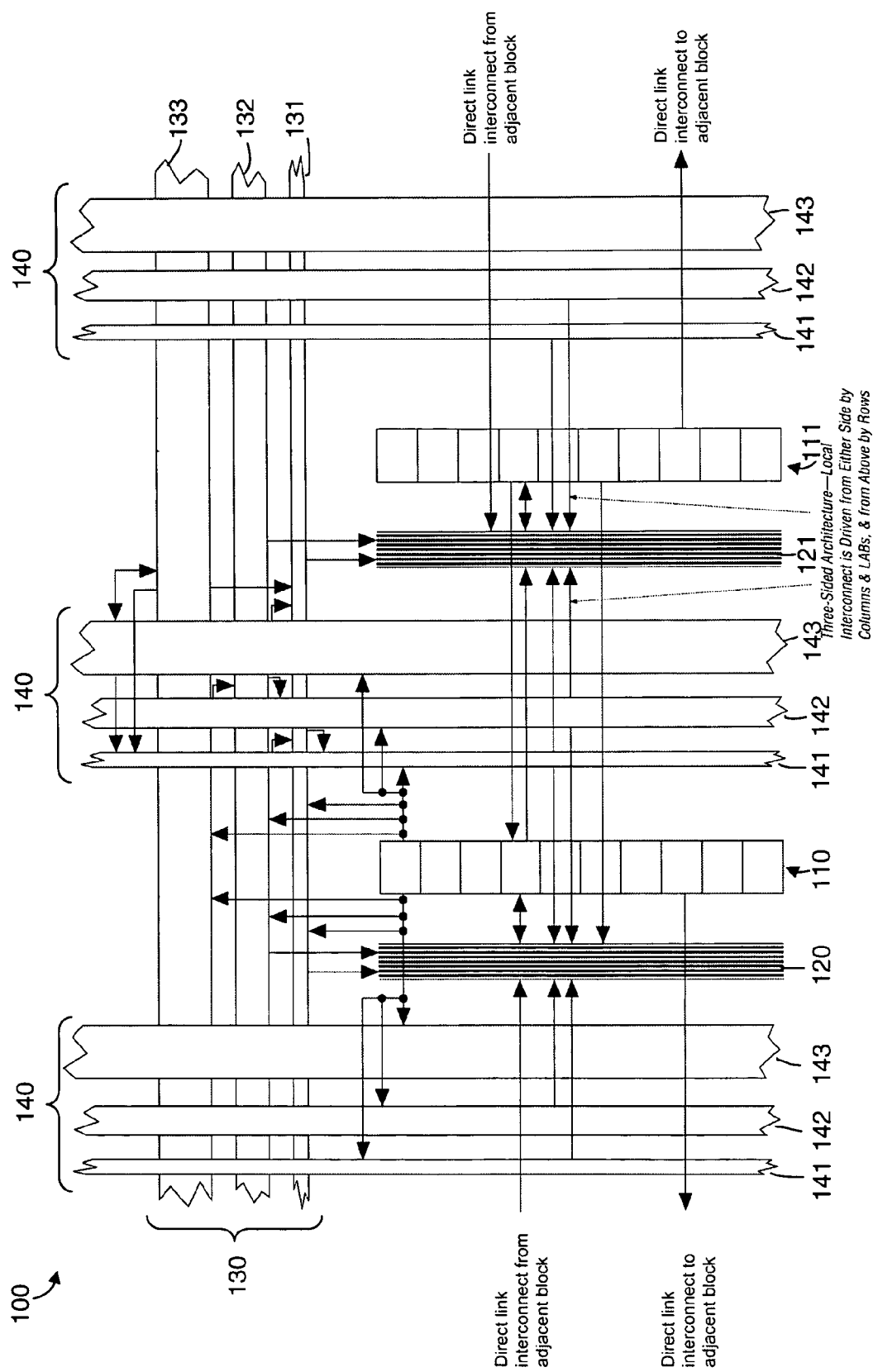
FIG. 1 illustrates a PLD according to an embodiment of the present invention.

FIG. 1 illustrates an exemplary target device 100 (PLD) according to an embodiment of the present invention. The present invention may be used to design a system onto the target device 100. According to one embodiment, the target device 100 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 100, an LE may include a 4-input lookup table (LUT) with a configurable flip-flop.

The target device 100 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 100. A first column of LABs is shown as 110 and a second column of LABs is shown as 111.

The target device 100 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 100.

The target device 100 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 100.

The target device 100 includes a plurality of input/output elements (IOEs) (not shown). Each IOE feeds an I/O pin (not shown) on the target device 100. The IOEs are located at the end of LAB rows and columns around the periphery of the target device 100. Each IOE includes a bidirectional I/O buffer and a plurality of registers for registering input, output, and output-enable signals. When used with dedicated clocks, the registers provide performance and interface support with external memory devices, for example.

The target device 100 includes LAB local interconnect lines 120–121 that transfer signals between LEs in the same LAB. The LAB local interconnect lines are driven by column and row interconnects and LE outputs within the same LAB. Neighboring LABs, memory blocks, IOEs, or DSP blocks may also drive the LAB local interconnect lines 120–121 through direct link connections.

The target device 100 also includes a plurality of row interconnect lines ("H-type wires") 130 that span fixed distances. Dedicated row interconnect lines 130, that include H4 131, H8 132, and H24 133 interconnects, route signals to and from LABs, DSP blocks, IOEs, and memory blocks within the same row. The H4 131, H8 132, and H24 133 interconnects span a distance of up to four, eight, and twenty-four LABs respectively, and are used for fast row connections in a four-LAB, eight-LAB, and twenty-four-LAB region. The row interconnects 130 may drive and be driven by LABs, DSP blocks, RAM blocks, and horizontal IOEs.

The target device 100 also includes a plurality of column interconnect lines ("V-type wires") 140 that operate similarly to the row interconnect lines 130. The column interconnect lines 140 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 140 include V4 141, V8 142, and V16 143 interconnects that traverse a distance of four, eight, and sixteen blocks respectively, in a vertical direction.

FIG. 1 illustrates an exemplary embodiment of a target device. It should be appreciated that a system may include a plurality of target devices, such as that illustrated in FIG. 1, cascaded together. It should also be appreciated that the target device may include programmable logic devices arranged in a manner different than that on the target device 100. A target device may also include components other than those described in reference to the target device 100. Thus, while the invention described herein may be utilized on the architecture described in FIG. 1, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Figure 2:
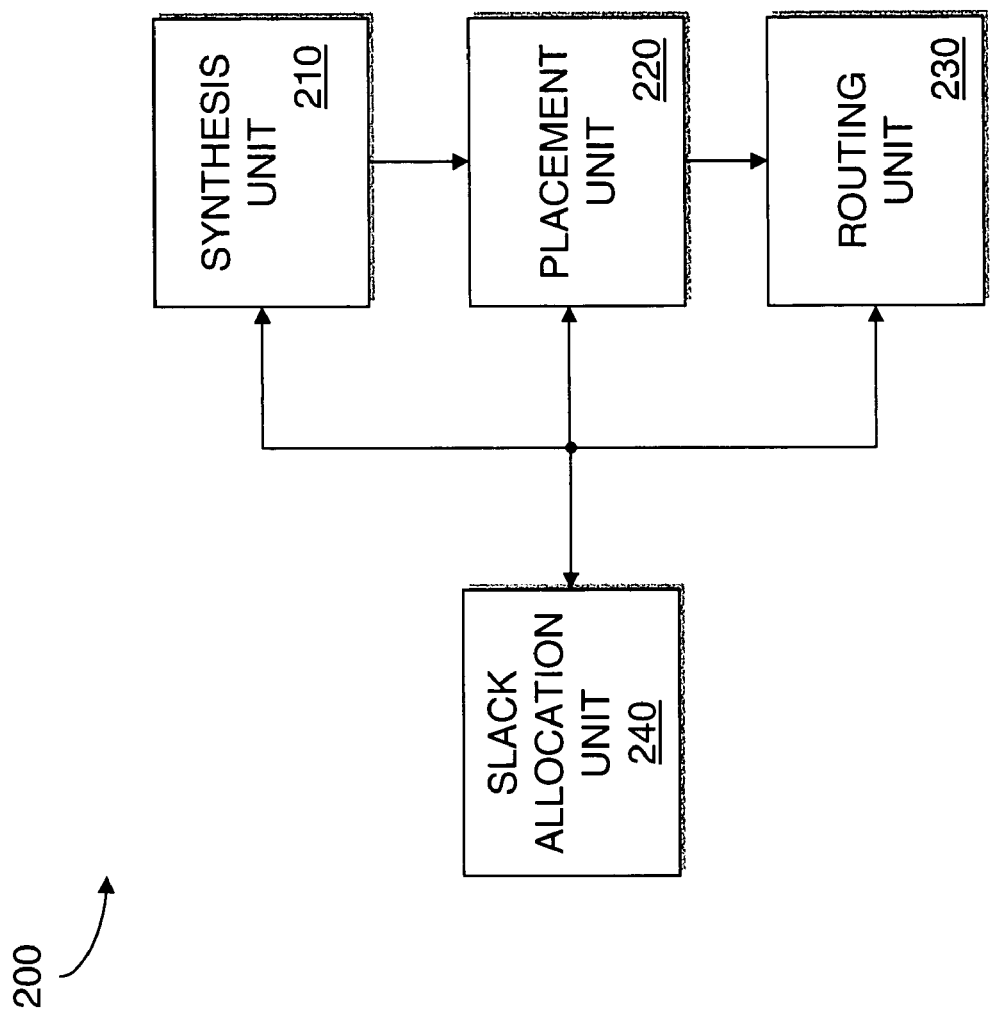
FIG. 2 illustrates a system designer according to an embodiment of the present invention.

FIG. 2 illustrates a system designer 200 according to an embodiment of the present invention. The system designer 200 may be an EDA tool. FIG. 2 illustrates software modules implementing an embodiment of the present invention. According to one embodiment, system design may be performed by a computer system (not shown) executing sequences of instructions represented by the software modules shown in FIG. 2. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software.

Block 210 represents a synthesis unit. The synthesis unit 210 generates a logic design of a system to be implemented by the target device 100 (shown in FIG. 1). According to an embodiment of the system designer 200, the synthesis unit 210 takes a conceptual Hardware Description Language (HDL) design definition and generates an optimized logical representation of the system. The optimized logical representation of the system generated by the synthesis unit 210 may include a representation that has a minimized number of functional blocks and registers, such as logic gates and logic elements, required for the system. Alternatively, the optimized logical representation of the system generated by the synthesis unit 210 may include a representation that has a reduced depth of logic and that generates a lower signal propagation delay. The synthesis unit 210 also determines how to implement the functional blocks and registers in the optimized logic representation utilizing specific resources on the target device 100 thus creating an optimized "technology-mapped" netlist. The technology-mapped netlist illustrates how the resources on the target device 100 are utilized to implement the system. The technology-mapped netlist may, for example, contain components such as LEs on the target device 100.

Block 220 represents a placement unit 220. The placement unit 220 fits the system on the target device 100 by determining which resources on the target device 100 are to be used for specific functional blocks and registers. According to an embodiment of the system designer 200, the placement unit 220 first determines how to implement portions of the optimized logic design in clusters. Clusters may represent a subset of the components on the target device 100 such as, for example, a LAB having 10 LEs. In this embodiment, after portions of the optimized logic design are implemented in clusters, the clusters may be placed by assigning the clusters to specific LABs on the target device 100. Following the placement of the clusters, routing interconnections between the LEs may be performed. The placement unit 220 may utilize a cost function in order to determine a good assignment of resources on the target device 100.

Block 230 represents a routing unit 230. The routing unit 230 determines the routing resources on the target device 100 to use to provide interconnection between the functional blocks and registers on the target device 100.

Block 240 represents a slack allocation unit 240. The slack allocation unit 240 receives data such as path-level long-path timing constraints and short-path timing constraints from a user. Long-path timing constraints may include, for example, maximum register-to-register delays in a clock domain, IO TSU requirements, and IO TCO requirements. Short-path timing constraints may include, for example, TH (hold-time) requirements, minimum TPD (minimum propagation delay) requirements, and minimum IO TCO (clock-to-output) requirements. The slack allocation unit 240 may also receive an achievable delay estimate, a lower delay limit, and an upper delay limit for each connection between functional blocks and registers on the target device 100 from one or more of the synthesis unit 210, placement unit 220, and routing unit 230. From this information, the slack allocation unit determines minimum and maximum delay budgets for each connection.

The synthesis unit 210, placement unit 220, and/or routing unit 230 may utilize the minimum and maximum delay budgets generated by the slack allocation unit 240 to determine a solution that satisfies long-path and short-path timing constraints. For example, the synthesis unit 210 may utilize a synthesis strategy that adds or removes levels of logic, uses slower or faster variants of a functional block, technology maps into faster or slower standard logic structures (such as carry chains), and/or uses faster or slower logic inputs based on the minimum and maximum delay budgets. The placement unit 220 may utilize a placement strategy that places functional blocks so they can (or are forced to) use slower/faster dedicated routing resources, and/or places functional blocks at appropriate distances from other functional blocks, based on the minimum and maximum delay budgets. The routing unit 230 may utilize a routing strategy that requires more or less routing resources, slower or faster routing resources, and delay chains (or additional buffers) based on the minimum and maximum delay budgets.

Figure 3:
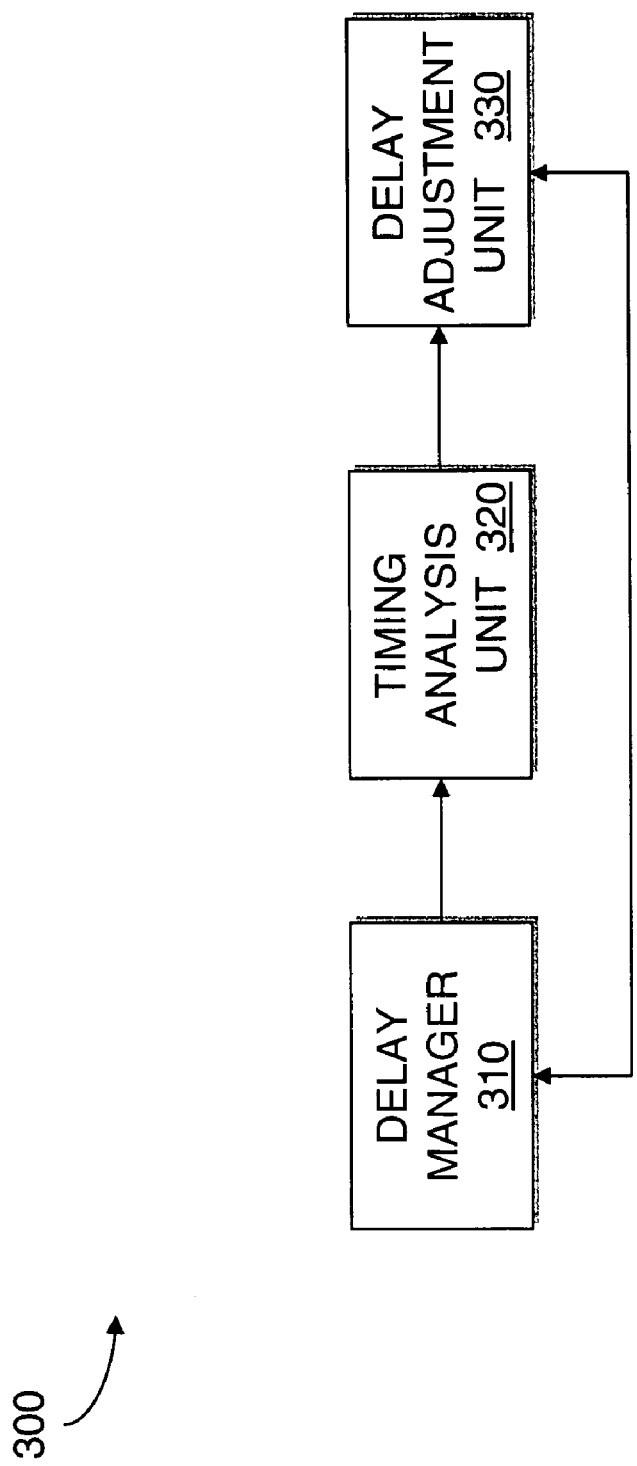
FIG. 3 is a block diagram of a slack allocator unit according to an embodiment of the present invention.

FIG. 3 is a block diagram illustrating a slack allocation unit 300 according to an embodiment of the present invention. The slack allocation unit 300 may be used to implement the slack allocation unit 250 illustrated in FIG. 2. The slack allocation unit 300 includes a delay manager 310. The delay manager 310 receives achieved delays, lower delay limits, and upper delay limits from one or more of the mapping unit 220, placement unit 230, and routing unit 240 (shown in FIG. 2). According to an embodiment of the slack allocation unit 300, an achievable delay for a connection represents an estimate of the delay that will be finally incurred, in the final programmed PLD, transmitting a signal between functional blocks. The achievable delay, being a realistic and "achievable" delay, should lie somewhere between the lower and upper delay limits (described next). Lower delay limits represent lower bounds for delays on connections. For example, the placement unit 230 (shown in FIG. 2) may set a lower delay limit on a connection if a PLD floor plan prevents two functional blocks from getting closer than a certain distance. Upper delay limits represent upper bounds for delays on connections. For example, the routing unit 240 may set an upper delay limit on a connection if the connection requires dedicated routing resources having a fixed delay. The delay manager 310 initially sets the achieved delays as the temporary delays for the connections and updates the temporary delays as the slack allocation unit 300 operates.

The slack allocation unit 300 includes a timing analysis unit 320. The timing analysis unit 320 receives the temporary delays, upper delay limits, and lower delay limits for the connections, short-path and long-path timing constraints for paths, and the logical design to be implemented by the target device 100 (shown in FIG. 1). The timing analysis unit 320 generates short-path and long-path slack numbers for each connection. According to one embodiment, a positive slack number for a connection indicates how much the delay on the connection in isolation can change before a worst-case path through that connection just meets its timing constraints. A negative slack number for a connection indicates how much the delay on the connection needs to change in order for that connection to meet its timing constraint. For example, a long-path slack number of 2 ns on a connection indicates that 2 ns of delay can be added to that connection before the worst-case path through that connection starts to violate its long-path timing constraint.

The slack allocation unit 300 includes a delay adjustment unit 330. The delay adjustment unit 330 operates to change the temporary delay for a connection in response to the short-path and long-path slack numbers for the connection. According to an embodiment of the slack allocation unit 300, the delay adjustment unit 330 first attempts to change the temporary connection delays until the short-path and long-path timing constraints are all met. In some cases, not all short-path and long-path timing constraints can be simultaneously met. In that case, this embodiment tries to achieve balanced failure (so no particular constraint is favoured in a set of competing constraints). After the temporary delays represent an assignment of delays that satisfy (or, in the case of very difficult constraints, for which the algorithm cannot find a solution that satisfies all constraints, come as close to satisfying the constraints as possible) all short-path and long-path timing constraints, the minimum and maximum delay budgets are determined. Unit 330 allocates and removes delay based on new positive long-path and short-path slack values re-computed by the timing analysis unit 320 in order to determine minimum and maximum delay budgets.

It should be appreciated that the synthesis unit 210, mapping unit 220, placement unit 230, routing unit 240, and slack allocation unit 250 in FIG. 2 and the delay manager 310, timing analysis unit 320, and delay adjustment unit 330 in FIG. 3 may be implemented using any known circuitry or technique. It should also be appreciated that not all the components shown in FIGS. 2 and 3 may be required to practice the present invention.

Figure 4:
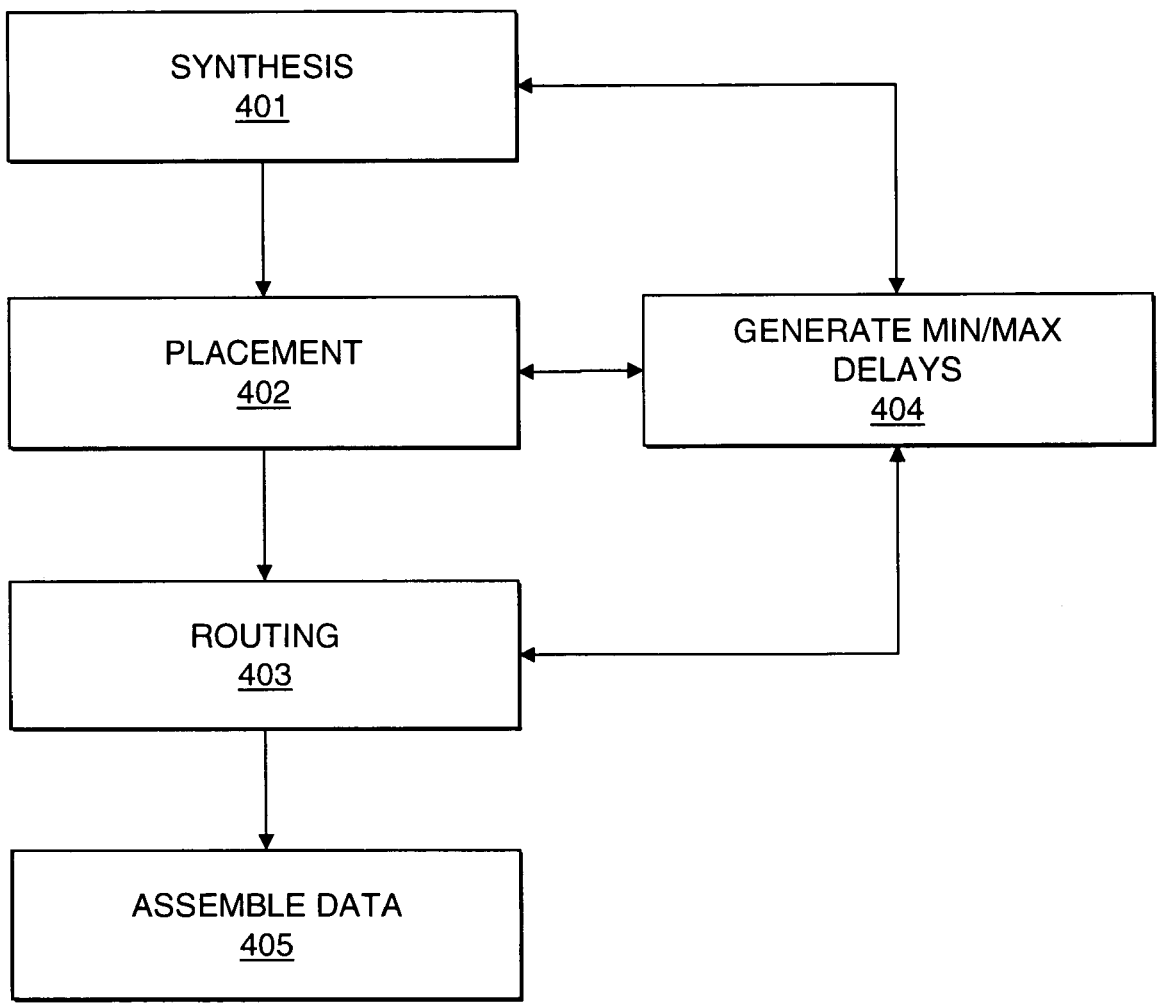
FIG. 4 is a flow chart illustrating a method for designing a system on a PLD according to an embodiment of the present invention.

FIG. 4 is a flow chart illustrating a method for designing a system on a PLD according to an embodiment of the present invention. At 401, the system is synthesized. Synthesis includes generating a logic design of the system to be implemented by a target device. According to an embodiment of the present invention, synthesis generates an optimized logical representation of the system from a HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 402, the mapped logical system design is placed. Placement works on the optimized technology-mapped netlist to produce a placement for each of the functional blocks. According to an embodiment of the present invention, placement includes fitting the system on the target device by determining which resources on the target device is to be used for specific logic elements, other function blocks, and some connections between the logic elements and the other function blocks.

At 403, it is determined which routing resources should be used to connect the functional blocks in the system. According to an embodiment of the present invention, routing may be performed in response to routing constraints provided.

At 404, minimum and maximum delay budgets are generated for each connection in the system. According to an embodiment of the present invention, minimum and maximum delay budgets are generated in response to data received by any one of the synthesis, placement, and routing procedures 401, 402, and 403. The minimum and maximum delay budgets are returned to the procedure and used by the procedure to generate a solution. It should be appreciated that minimum and maximum delay budgets may be generated for one or more of the mapping, placement, and routing procedures 401, 402, and 403 in response to data received by the procedure. According to one embodiment, generating minimum and maximum delay budgets involves, first, allocating delay in order to find a set of delays that satisfy long-path and short-path timing constraints and, second, allocating long-path and short-path slack to determine the delay budgets. These procedures will be further described with reference to FIGS. 5 and 6.

At 405, an assembly procedure is performed. The assembly procedure involves creating a data file that includes information determined by the fitting procedure described by 401–404. The data file may be a bit stream that may be used to program the target device.

Figure 5:
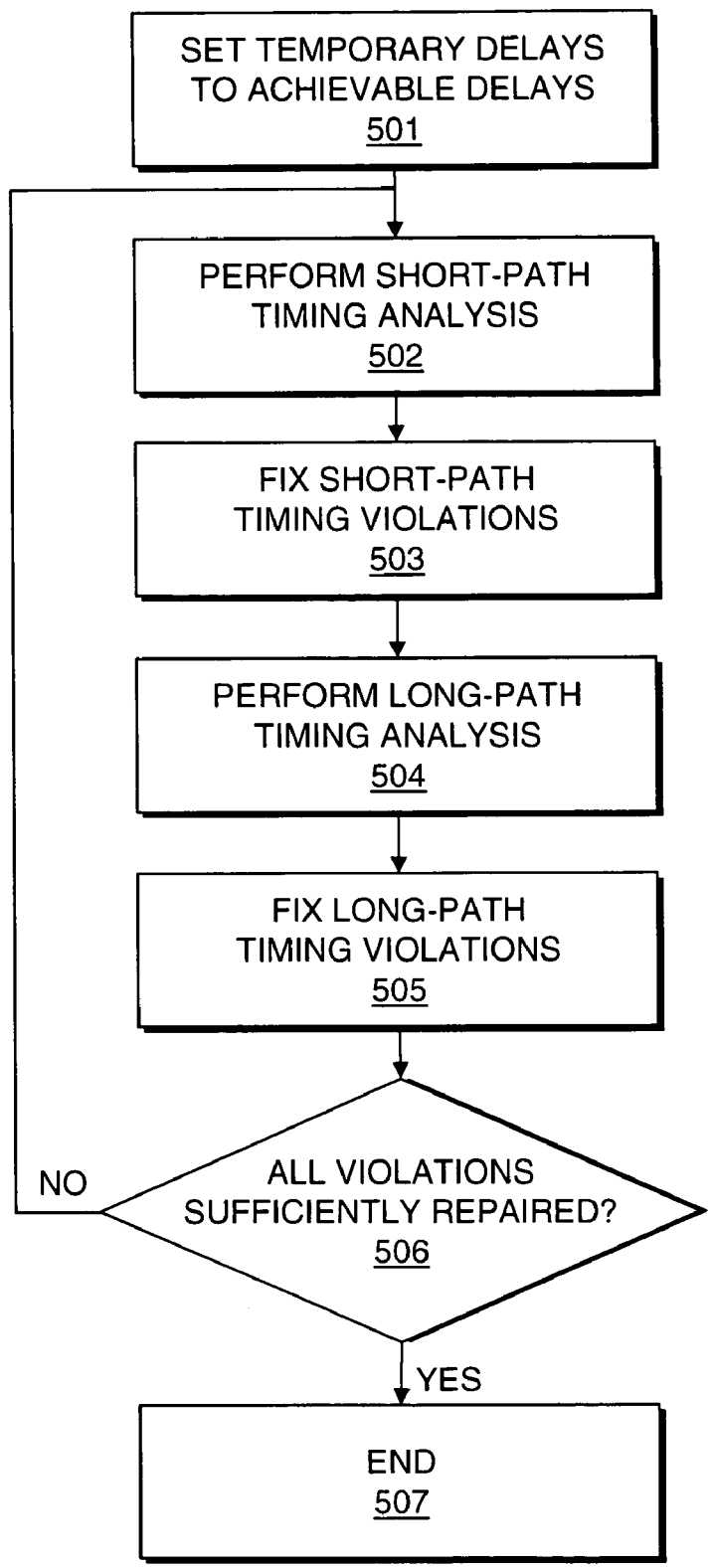
FIG. 5 is a flow chart illustrating a method for allocating delay in order to satisfy long-path and short-path timing constraints according to an embodiment of the present invention.

FIG. 5 is a flow chart illustrating a method for allocating delay in order to satisfy long-path and short-path timing constraints. According to an embodiment of the present invention, allocating delay involves augmenting temporary delays for the connections between functional blocks and registers to meet long-path and short-path timing constraints. This (first procedure) is done to generate a good starting point (set of delays) for the slack allocation iterations (second procedure) that are used to compute the minimum and maximum delay budgets. The second procedure tries to achieve minimum and maximum delay budgets that are wide apart (and within realistic delay limits). This gives the synthesis/placement/routing tool the most flexibility. The first procedure provides the second procedure with a good starting point, so the second procedure has a greater potential to achieve a "superior" solution more quickly. At 501, temporary delays for routing the connections between functional blocks and registers are set to achievable delays for routing the connections between functional blocks and registers. According to an embodiment of the present invention, achievable delays are determined by one of the mapping, placement, or routing procedures 402, 403, or 404 (shown in FIG. 4). The achievable delays may be initial estimates of final delays in the PLD generated with information available at the time. According to one embodiment, achievable delays for connections (in the router) are set to the lower delay limits for the connections (based on estimated routes ignoring congestion, but minimizing delay).

At 502, short-path timing analysis is performed. According to an embodiment of the present invention, short-path slack values are generated for each connection. A positive short-path slack value represents how much delay can be subtracted from a connection provided all other connections stay the same before a worst-case path running through it is on the verge of failing its short-path timing constraint. A negative short-path slack value indicates how much delay must be added to a connection, provided all other connections stay the same before the worst case path meets its short-path timing constraint. A negative short-path slack value indicates a short-path timing constraint violation.

To determine a short-path slack value for a connection, for each path through the connection, a cumulative delay for the path is computed. This may be computed by summing the temporary delays associated with the connections on the path. The short-path timing constraint for the path is subtracted from the cumulative delay of the path to determine a path slack value. The smallest path slack value is the short-path slack value for the connection. It should be appreciated that short-path slack values may be computed by performing other techniques. For example, well-known netlist traversal techniques exist to compute the short-path slack values in time proportional to the number of connections in the netlist. At 503, short-path timing constraint violations are fixed. According to an embodiment of the present invention, short-path timing constraints are fixed by adding delay to temporary delays based on (negative) short-path slack values from short-path timing analysis and connection weightings. Positive short-path slack values indicate the timing constraint is already met and those connections do not need fixing. For example, the delay added to a temporary delay associated with a connection may be the absolute value of the negative short-path slack value of the connection multiplied by the weight of the connection divided by the weight of the largest weight path (or a larger number, if estimates are used) passing through the connection. The weight of a connection may be determined using various techniques such as unit weighting, weighting proportional to the delay that can be added to/removed from the connection, and other types of weighting schemes. The weight of a path is determined by summing the individual connection weights along the path. It should be noted that there are many techniques for computing these path weights and assigning the appropriate path weights to connections. Conservative approximations (that may give weights larger than the largest weight path passing through the connection) can be efficiently computed using well-known netlist traversal techniques that operate in time proportional to the number of connections in the netlist. It is important if estimates are used for the denominator that the estimates are larger than the correct values so (negative) slack will not be over-allocated. Overshooting the target (by over-allocating) increases the chance of introducing an unnecessary violation. It should be appreciated that the amount of delay added to the temporary delay may be adjusted to ensure that the adjusted temporary delay remains within its lower and upper delay limits.

At 504, long-path timing analysis is performed. According to an embodiment of the present invention, long-path slack values are generated for each connection. A positive long-path slack value represents how much delay can be added to a connection, provided all other connections stay the same, before a worst-case path running through it is about to fail its long-path timing constraint. A negative long-path slack value indicates how much delay must be subtracted from a connection, provided all other connections stay the same, before the worst case path just meets its long-path timing constraint. A negative long-path slack value indicates a long-path timing constraint violation.

To determine a long-path slack value for a connection, for each path through the connection, a cumulative delay for the path is computed. This may be computed by summing the temporary delays associated with the connections on the path. The cumulative delay for the path is subtracted from the long-path timing constraint of the path to determine a path slack value. The smallest path slack value is the slack value for the connection. It should be appreciated that long-path slack values may be computed by performing other techniques. For example, well-known netlist traversal techniques exist to compute the long-path slack values in time proportional to the number of connections in the netlist.

At 505, long-path timing constraint violations are fixed. According to an embodiment of the present invention, long-path timing constraints are fixed by removing delay from temporary delays based on (negative) long-path slack values from long-path timing analysis and connection weightings. For example, the delay subtracted from a temporary delay associated with a connection may be the magnitude of the negative long-path slack value of the connection multiplied by the weight of the connection divided by the weight of the largest weight path through the connection. The weight of a connection and the path weights may be determined using the various techniques described above, for example. It should be appreciated that the amount of delay subtracted from the temporary delay may be adjusted to ensure that the adjusted temporary delay remains within its lower and upper delay limits.

At 506, it is determined whether all short-path and long-path violations are sufficiently repaired. If all short-path and long-path violations are sufficiently repaired, control terminates the process as shown in 507. If not all short-path and long-path violations are sufficiently repaired, control returns to 502. It should be appreciated that instead of determining whether all violations are sufficiently repaired, 506 may determine whether an N number of iterations of 502–505 have been performed before terminating the process.

Figure 6:
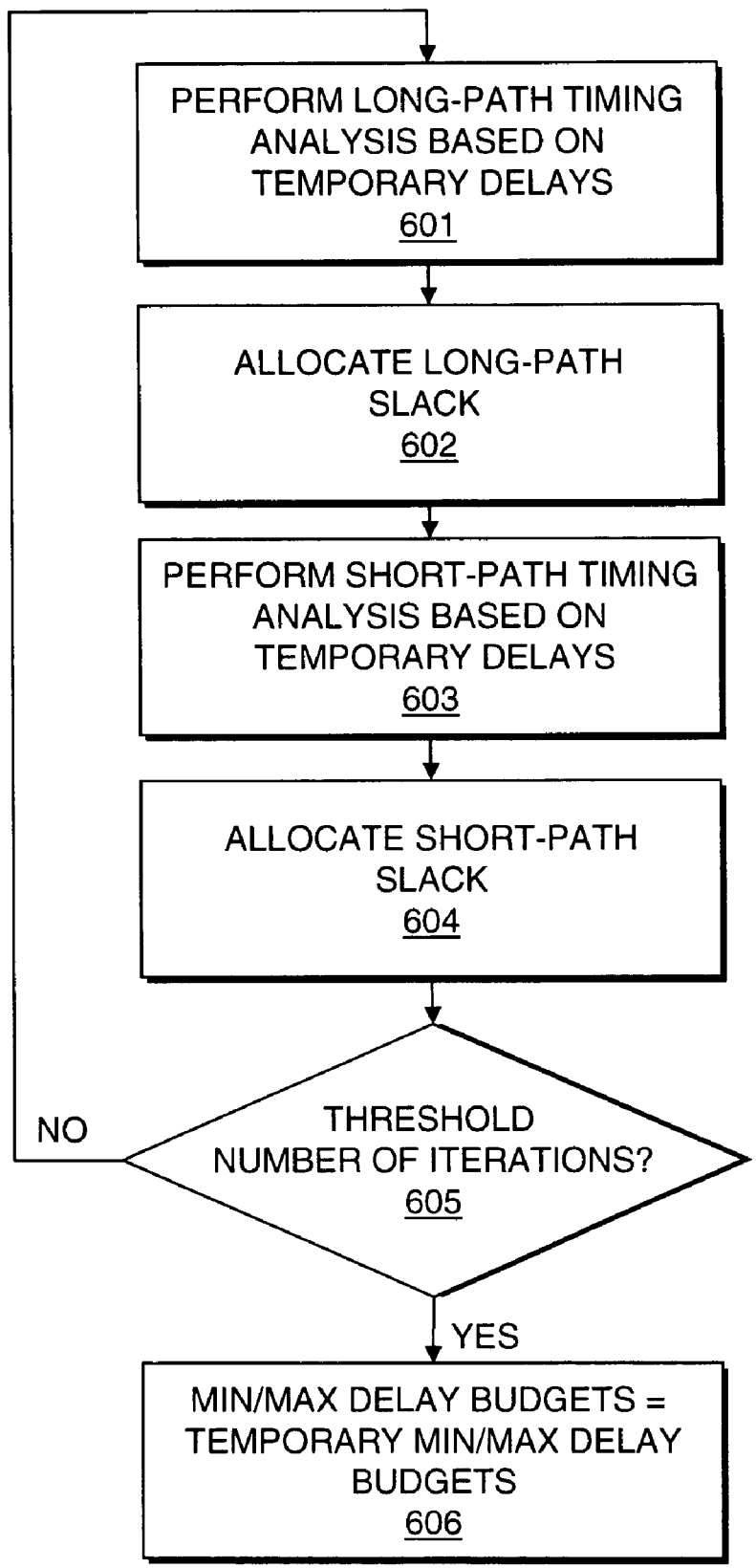
FIG. 6 is a flow chart illustrating a method for allocating long-path and short-path slack according to an embodiment of the present invention.

FIG. 6 is a flow chart illustrating a method for allocating long-path and short-path slack according to an embodiment of the present invention. At 601, long-path timing analysis is performed based on temporary delays. According to an embodiment of the present invention, the temporary delays may be initially generated by performing the procedure described in FIG. 5. Other embodiments may use achievable delay estimates produced by the synthesis/placement/routing tool. Long-path slack values are generated for each connection. The long-path slack values may be generated using the technique described with reference to 504 shown in FIG. 5.

At 602, positive long-path slack values are allocated. Connections with positive slack lie on paths that are all meeting their timing. Long-path slack values may be allocated by adding delay to temporary delays based on long-path slack values and connection weightings. According to an embodiment of the present invention, long-path slack values may be allocated by adding a positive long-path slack value of a connection multiplied by its connection weighting, divided by the weight of the largest weight path through the connection, to a temporary delay associated with the connection. This sum then becomes the new temporary maximum delay budget and the new temporary delay. The weight of a connection and the path weights may be determined using the various techniques described above, for example. It should be appreciated that the amount of slack allocated may be adjusted to ensure that the adjusted temporary delay remains within its lower and upper delay limits.

At 603, short-path timing analysis is performed based on the temporary delays from 602. Short-path slack values are generated for each connection. The short-path slack values may be generated using the technique described with reference to 502 shown in FIG. 5.

At 604, positive short-path slack values are allocated. Connections with positive slack lie on paths that are all meeting their timing. Short-path slack values may be allocated by subtracting delays from temporary delays based on short-path slack values and connection weightings. According to an embodiment of the present invention, short-path slack values may be allocated by subtracting a positive short-path slack value of a connection multiplied by its connection weighting, divided by the weight of the largest weight path through the connection, from a temporary delay associated with the connection. The result of the subtraction is becomes the new temporary minimum delay budget and the new temporary delay. It should be appreciated that the amount of slack allocated may be adjusted to ensure that the adjusted temporary delay remain within its lower and upper delay limits.

At 605, it is determined whether M number of iterations of 601–604 have been performed. If M number of iterations have been performed, control proceeds to 606. If M number of iterations have not been performed, control returns to 601. It should be appreciated that any number may be designated for M. According to an embodiment of the present invention, a number of M is designated that allows for a sufficient number of iterations to be performed to increase the distance between minimum and maximum delay budgets (delay budget windows) for all connections. Large delay budget windows (within legal lower/upper delay limits) are favorable to increase the flexibility offered to synthesis/placement/routing tools. Since the minimum/maximum delay budgets become constraints that the tools need to respect to satisfy timing, looser constraints (larger windows) are favorable.

At 606, the temporary maximum and minimum delay budgets for the connections are designated as the maximum and minimum delay budgets for the connections.

It should be appreciated that successive over-relaxation may be used to speed convergence when assigning slack. According to an embodiment of the present invention, successive over-relaxation over allocates slack. Modifications may be made to compensate for the over-allocation by allowing for slack removal if necessary.

Figure 7:
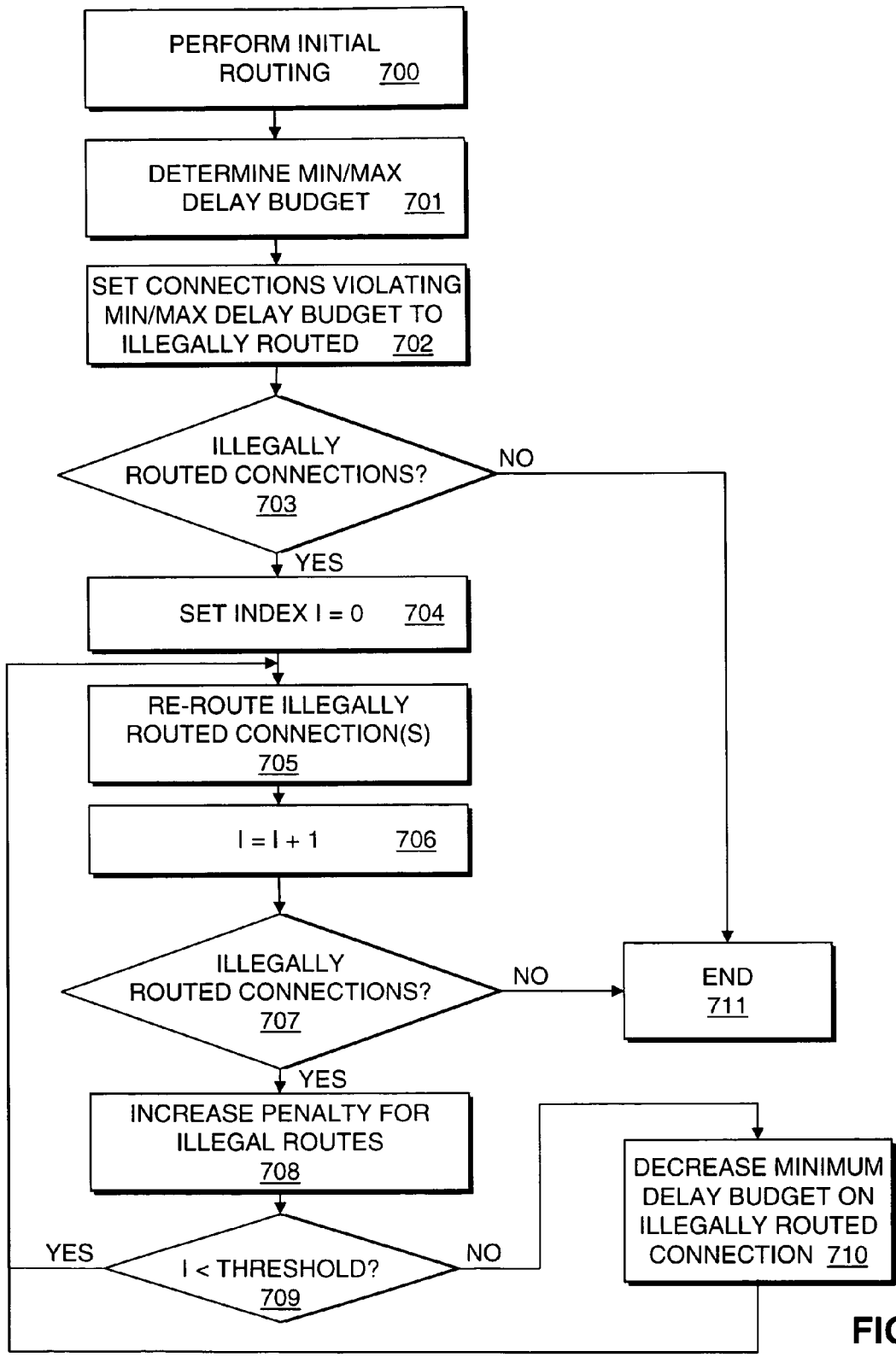
FIG. 7 is a flow chart illustrating a method for routing using long-path and short-path timing constraints according to an embodiment of the present invention.

FIG. 7 is a flow chart illustrating a method for routing using long-path and short-path timing constraints according to an embodiment of the present invention. The method shown may be used to implement procedure 403 and 404 shown in FIG. 4. At 700, an initial routing is performed on the connections of the PLD. According to one embodiment, a set of routing resources are selected to route from sources of the connections to sinks of the connections. Initially, the routing resources may be selected to minimize the connection delays. Connections driven by the same source can share the same routing resources since they carry the same signals. Connections driven by different sources that share the same routing resources are determined to be illegally routed or "shorted" together. From the initial routing, achievable delays for the connections are generated (and these delays are also used as lower delay limits).

According to an embodiment of the present invention, the routing algorithm uses a heap (to guide a directed search) and a look-ahead (to estimate delays) to route a connection with minimal delay. Starting at the source of a connection, the routing procedure searches through the routing fabric towards the destination along routing resources that it thinks are promising. The routing procedure uses a heap to determine which is the most promising routing resource to explore next. The cost used to "score" routing resources on the heap may be dependent on criteria including the delay from the source to the routing resource, the delay of the routing resource, the estimated delay from the routing resource to the sink (estimated using what is called the look-ahead), and a penalty for using a routing resource that has already been selected for another connection driven by a different source. Starting at the source, the router inserts the routing resources reachable from the source on the heap (with their appropriate scores). The router then removes the "most promising" routing resource from the heap, in turn, inserting the resources reachable from this "most promising" routing resource (with their appropriate scores). After repeating this process, eventually the destination will be removed from the heap and routing of the connection will be complete. The router keeps track of which resources were reached from which resources, so when the destination is removed from the heap, the router is able to trace back and figure out all the routing resources used to route the connection.

At 701, minimum and maximum delay budgets are generated for the connections. The minimum and maximum delay budgets may be determined from the achievable delays determined for each connection from 701, lower delay limits set by the achieved delays, upper delay limits that may be based on the routing resources available between functional blocks, and long-path and short-path timing constraints. According to an embodiment of the present invention, minimum and maximum delay budgets may be determined using the procedures described in FIGS. 5 and 6.

At 702, all connections having a delay outside the minimum and maximum delay budgets are designated as being illegally routed.

At 703, it is determined whether any illegally routed connections exist. According to an embodiment of the present invention, a shorted connection may be considered an illegally routed connection. If illegally routed connections exist, control proceeds to 704. If illegally routed connections do not exist, control proceeds to 712.

At 704, an index I is set to 0.

At 705, illegally routed connections are re-routed. According to an embodiment of the present invention, a set of routing resources is selected for each connection that was illegally routed to try to avoid using routing resources that have been selected to route differently sourced connections (based on the cost function described above). The set of routing resources are also selected to keep the total connection delay within its minimum and maximum delay budget. According to an embodiment of the present invention, the minimum and maximum delay budgets are utilized to converge on a solution that satisfies long-path and short-path timing constraint. For example, delay may be added to a connection by using extra wiring or slower delay chains on connections with large minimum delay budgets. Delay may also be reduced by avoiding routing resources that would slow down connections to a point where the maximum delay budget would be violated. The look-ahead and heap (of a minimum delay router) described in 701 may be used to re-route the illegally routed connections. However, the heap must be adjusted, in this embodiment, by changing the scoring of a routing resource to cost not the expected connection delay if the routing resource is used, but the amount the expected connection delay is going to violate the delay budgets. The look-ahead, in this embodiment, must be adjusted to understand the delay budget target, so it estimates a delay that the router can achieve given that it is trying to hit the minimum/maximum delay budget. Adjusting the look-ahead is important so that the heap properly evaluates competing routing resources. For example, if the look-ahead over-estimates delay, the router will use short/faster routes at the beginning of a path thinking that the future (look-ahead predicted) delay will be large. However, it will end up needing to use slow/longer routes at the end of the path to make up for this which may be unfavorable if the resources do not exist at the destination to slow down the connection.

At 706, index I is incremented by 1.

At 707, it is determined whether any illegally routed connections exist. According to an embodiment of the present invention, a shorted connection may be considered an illegally routed connection. If illegally routed connections exist, control proceeds to 708. If illegally routed connections do not exist, control proceeds to 711.

At 708, a penalty for illegal routing is increased. According to an embodiment of the present invention, the cost function described in 701 and 705 and used in 701 and 705 is adjusted to reflect the increase in penalty.

At 709, it is determined whether index I is less than a threshold value. If index I is less than a threshold value, control returns to 705. If index I is greater than the threshold value, control proceeds to 710.

At 710, the minimum delay budget is decreased on illegally routed connections. Control proceeds to 705.

At 711, control terminates the procedure.

It should be appreciated that at 703 and 707, routing resources selected for a connection may also be checked to determine whether they meet the minimum and maximum delay budget for the connection. In this embodiment, connections not meeting the minimum and maximum delay budgets may be re-routed.

FIGS. 4–7 are flow charts illustrating methods according to embodiments of the present invention. The techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques.

Figure 8A:
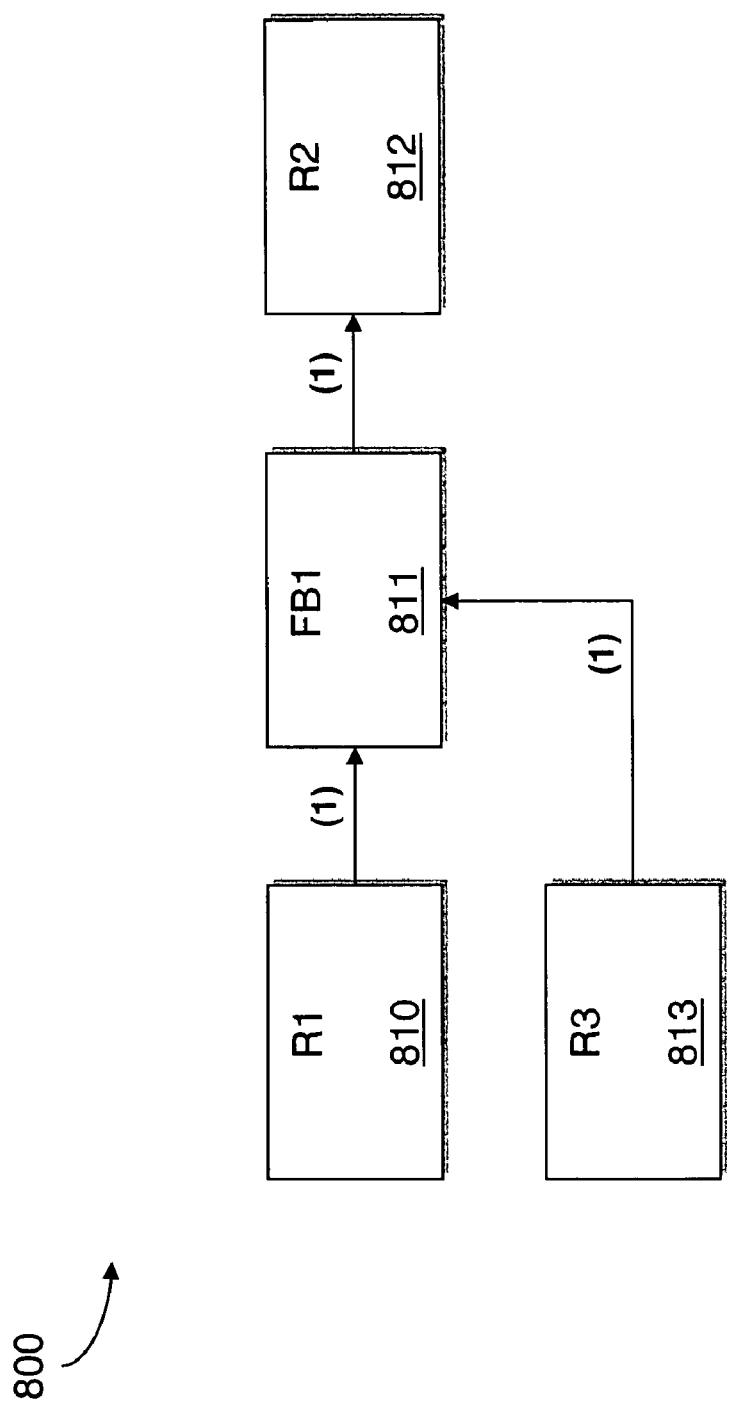
FIGS. 8(a)–(k) illustrate an example of how minimum and maximum connection delay budgets are determined from long-path and short-path path-level timing constraints according to an embodiment of the present invention.

FIGS. 8a–k illustrate an example of determining minimum and maximum delay budgets for connections in a PLD. Referring to FIG. 8a, minimum and maximum delay budgets are determined for connections attaching functional block and registers 810–813 in circuit 800. In this example, one path passes from register R1 810, to functional block FB1 811, to register R2 812. A second path passes from register R3 813, to functional block FB 811, to register R2 812. A long-path timing constraint of 10 ns is specified for the path from R1 810 to R2 812 and a long-path timing constraint of 20 ns is specified for the path from R3 813 to R2 812. A short-path timing constraint of 5 ns is specified for the path from R1 810 to R2 812 and a short-path timing constraint of 2 ns is specified for the path from R3 813 to R2 812.

With reference to FIG. 5, delay is allocated in order to satisfy long-path and short-path timing constraints. At 501, temporary delays for routing the connections between functional blocks and registers are set to achievable delays for routing the connections between functional blocks and registers. In this example, achievable delays are determined to be 1 ns between each of the connections between R1 810 and FB1 811, FB1 811 and R2 812, and R3 813 and FB1 811. These are shown in parenthesis. The lower delay limit for each of the connections is set to the achievable delays for the connections. The upper delay limit for each of the connections is set to 100 ns.

Figure 8B:
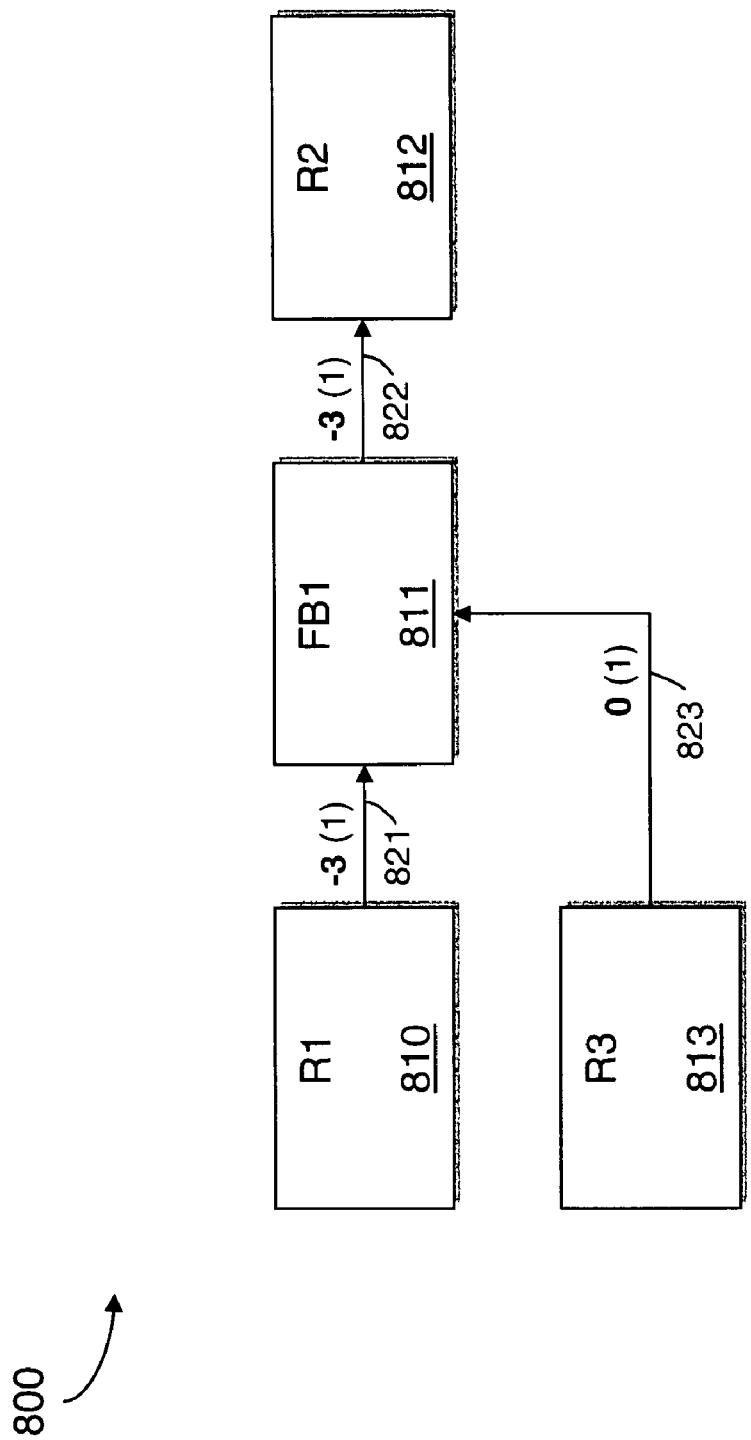

At 502, short-path timing analysis is performed as shown in FIG. 8b. To determine a short-path slack value for a connection, for each path through the connection, a cumulative delay for the path is computed. This may be computed by summing the temporary delays associated with the connections on the path. For path 1 through R1 810, FB1 811, and R2 812, the cumulative delay is 2 ns. The short-path timing constraint for the path, 5 ns, is subtracted from the cumulative delay, 2 ns, to determine a path slack value-3 ns. For path 2 through R3 813, FB1 811, and R2 812, the cumulative delay is 2 ns. This short-path timing constraint for the path, 2 ns, is subtracted from the cumulative delay, 2 ns, to determine a path slack value 0. The path slack value having the lowest value is the short-path slack value for the connection. For the connection 821 between R1 810 and FB1 811, the short-path slack value is −3 ns. For the connection 822 between FB1 811 and R2 812, the short-path slack value is −3 ns. For the connection 823 between R3 813 and FB1 811, the short-path slack value is 0. Connections 821 and 822 have short-path timing constraint violations.

Figure 8C:
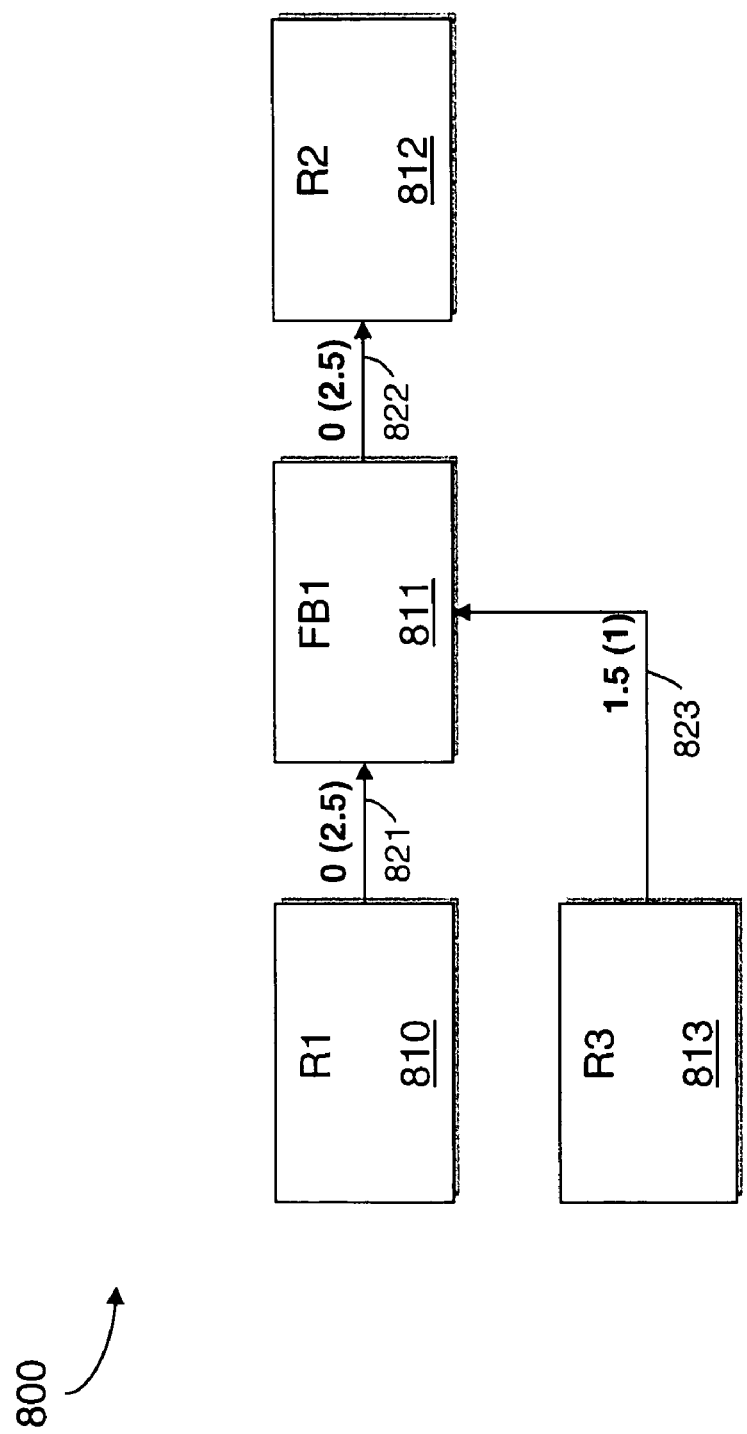

At 503, short-path timing constraint violations are fixed as shown in FIG. 8*c*. According to an embodiment of the present invention, short-path timing constraints are fixed by adding delay to temporary delays based on short-path slack values from short-path timing analysis and connection weightings. The delay added to the temporary delay associated with connection 821 is the magnitude of the negative short-path slack value of the connection 821, 3 ns, multiplied by the weight of the connection, 1, divided by the largest path weight of all paths passing through the connection, 2. Notice by using the largest path weight of all paths passing through the connection in the denominator, (negative) slack will never be over-allocated. A larger number in the denominator may be used if the number needs to be approximated. Convergence may be hindered but it is important that (negative) slack not be over-allocated or the algorithm will diverge. The new temporary delay is 2.5 ns. The weight of a connection is determined throughout this example using unit weighting. The delay added to the temporary delay associated with connection 822 is the negative short-path slack value of the connection 821, 3 ns, multiplied by the weight of the connection, 1, divided by the largest path weight of all paths passing through the connection, 2. The new temporary delay is 2.5 ns.

Figure 8D:
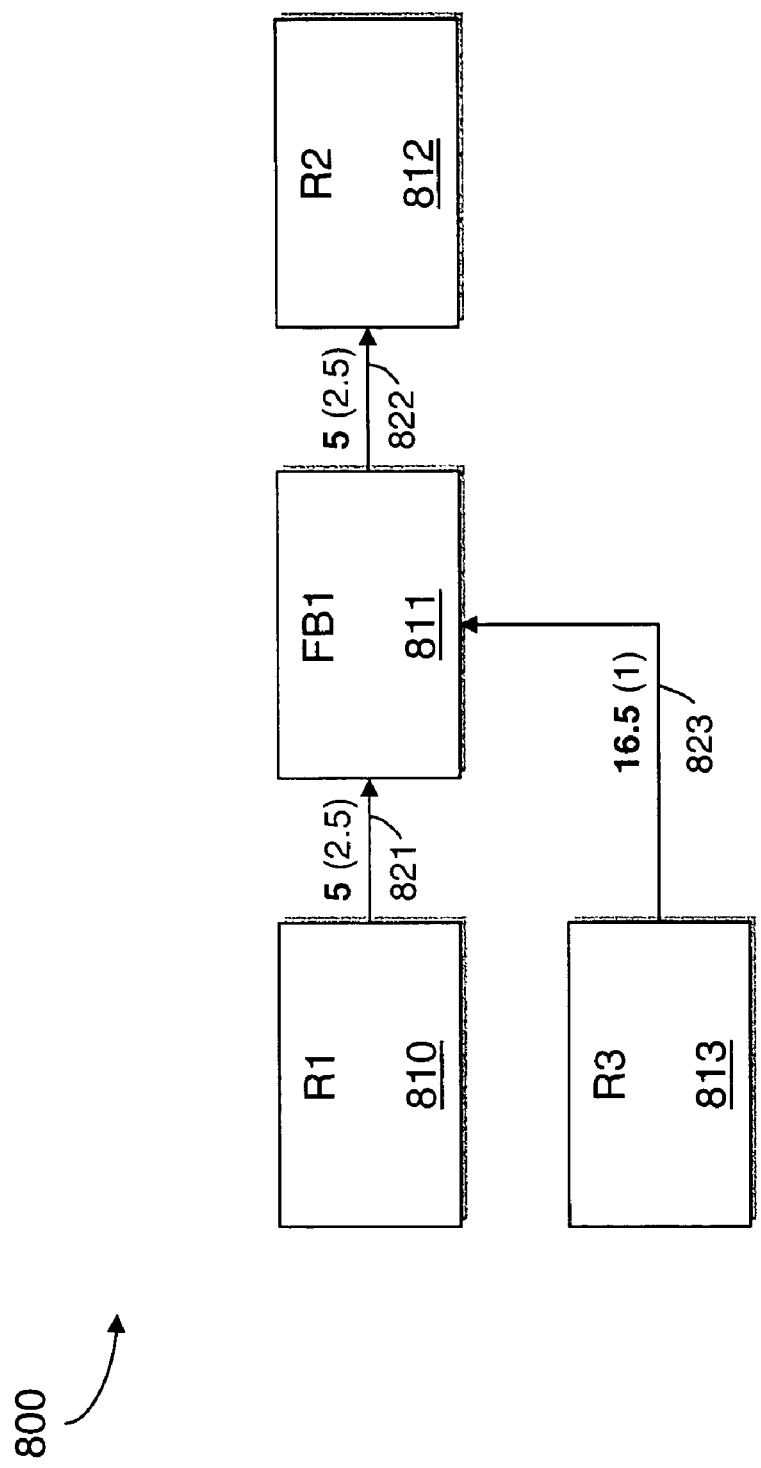
Figure 8E:
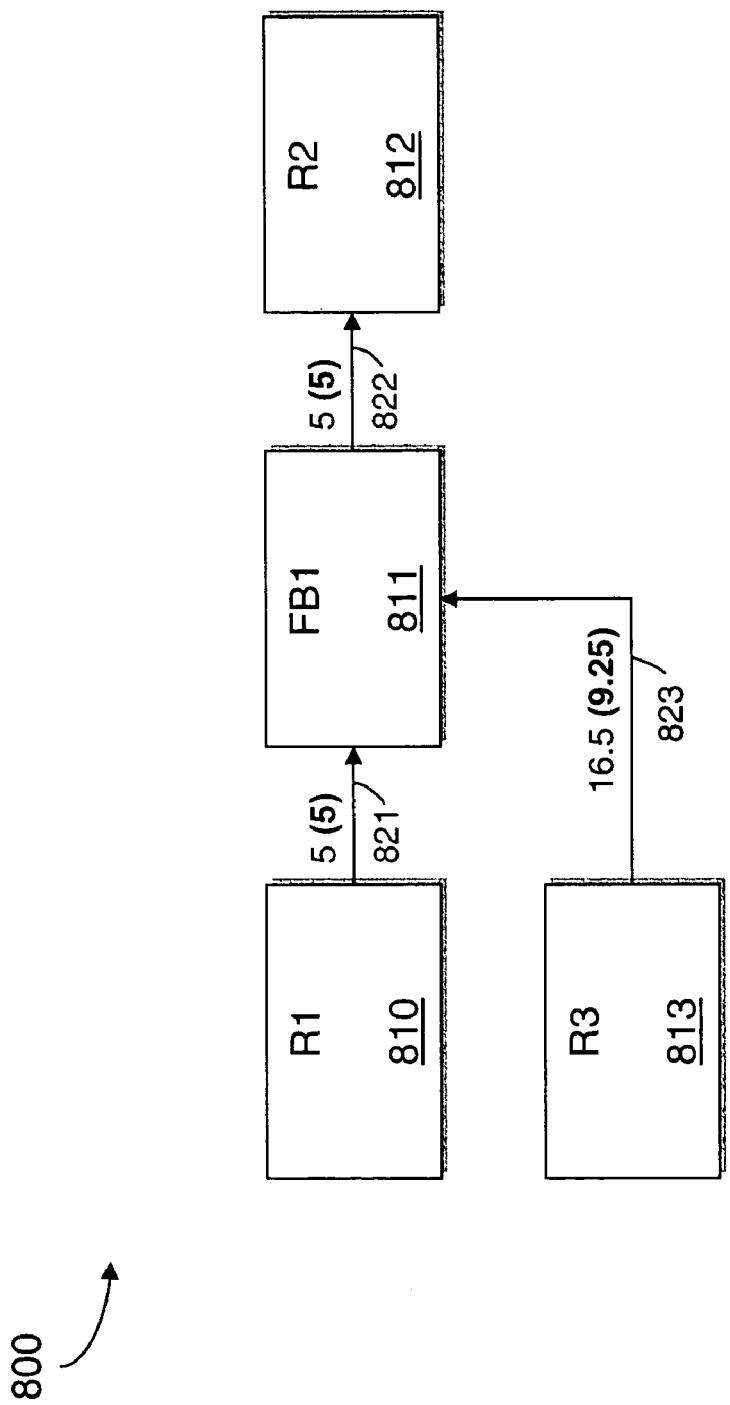
Figure 8F:
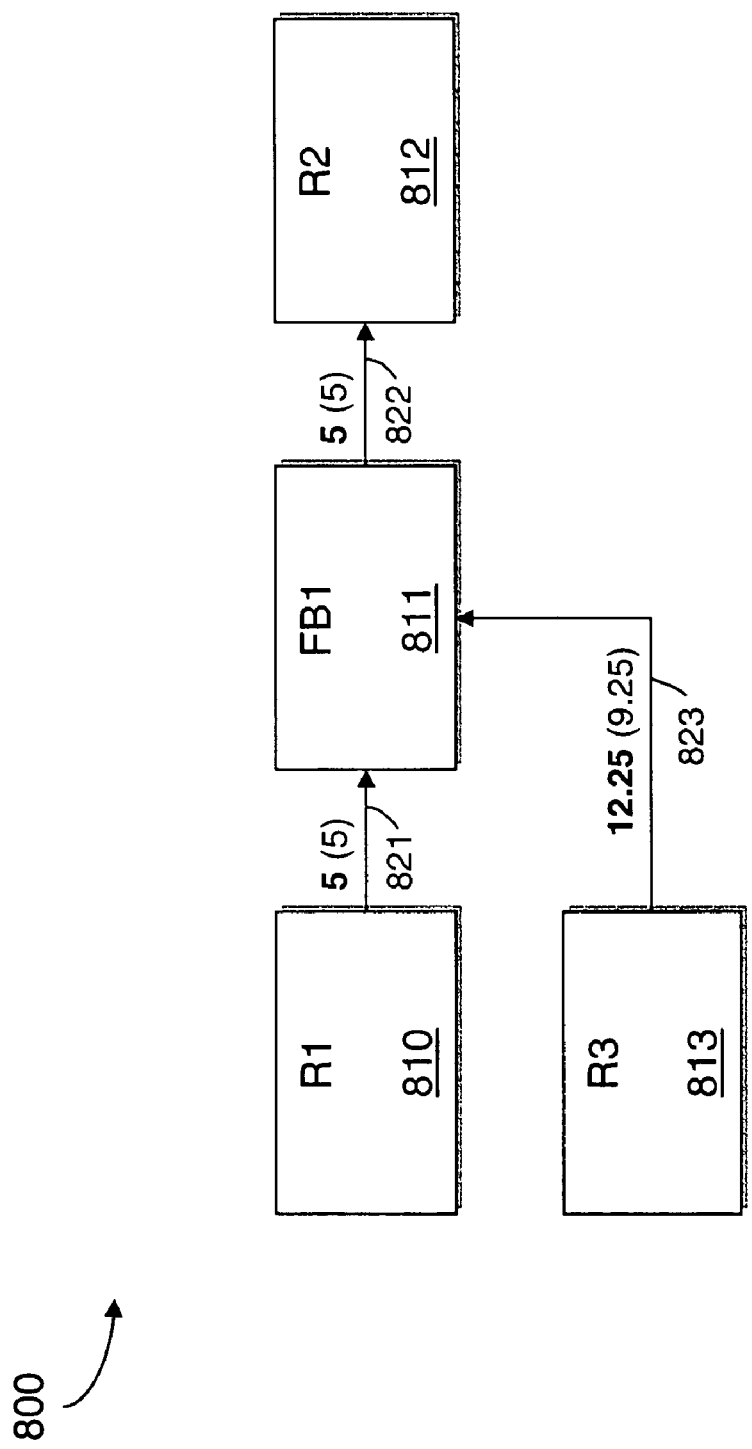
Figure 8G:
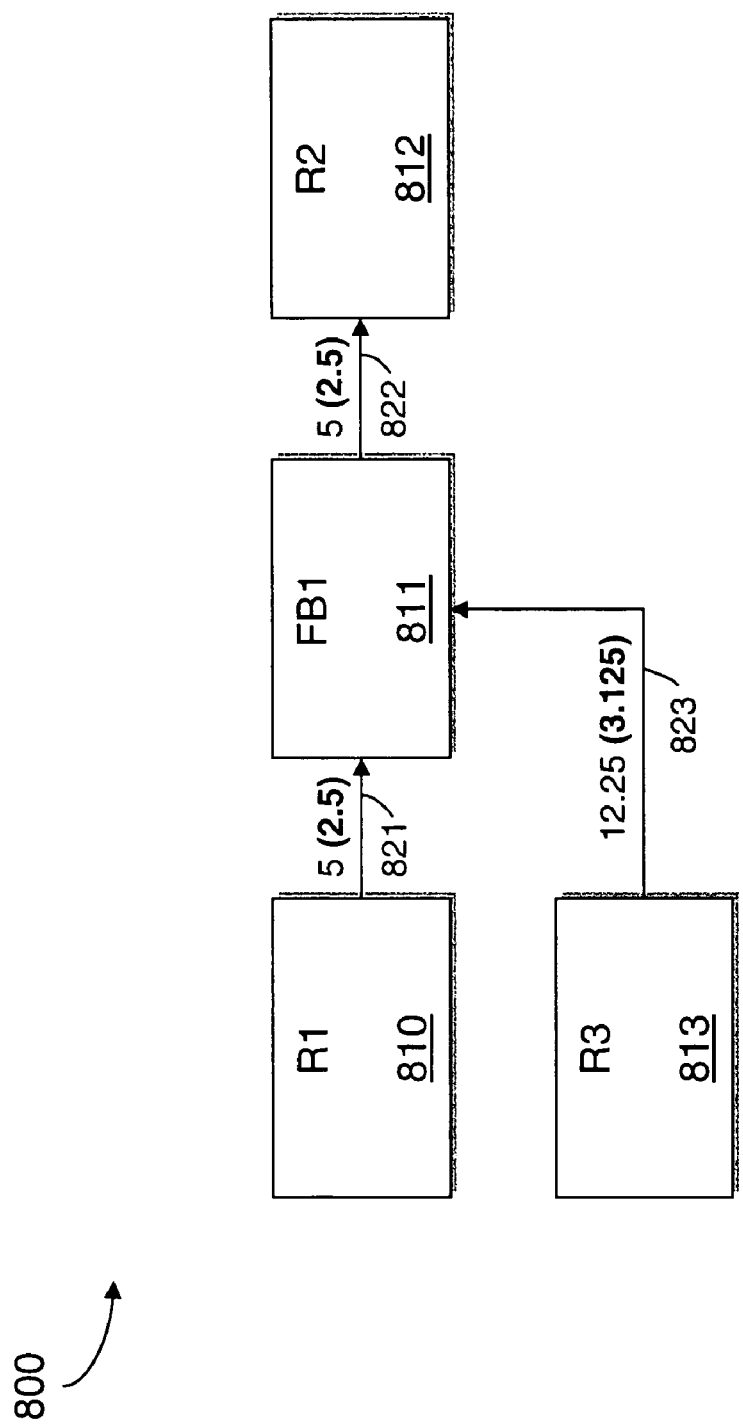

At 504, long-path timing analysis is performed as shown in FIG. 8*d*. To determine a long-path slack value for a connection, for each path through the connection, a cumulative delay for the path is computed. This may be computed by summing the temporary delays associated with the connections on the path. For path 1 through R1 810, FB1 811, and R2 812, the cumulative delay is 5 ns. This cumulative delay, 5 ns, is subtracted from the long-path timing constraint for the path, 10 ns, to determine a path slack value 5 ns. For path 2 through R3 813, FB1 811, and R2 812, the cumulative delay is 3.5 ns. This cumulative delay, 3.5 ns, is subtracted from the long-path timing constraint for the path, 20 ns, to determine a path slack value 16.5 ns. The path slack value having the lowest value is the long-path slack value for the connection. For connection 821, the long-path slack value is 5 ns. For connection 822, the long-path slack value is 5 ns. For connection 823, the long-path slack value is 16.5 ns. Since all long-path slack values are positive, there are no long-path timing constraint violations.

At 505, long-path timing constraint violations are fixed. Since no long-path timing constraints exist, control proceeds to 506.

At 506, it is determined that all short-path and long-path violations are sufficiently repaired and that delay has been sufficiently allocated to satisfy both long-path and short-path timing constraints. That is, the achievable (initial) delays were adjusted minimally to find a set of delays that meet the timing requirements—to prepare for the next phase of the algorithm.

With reference to FIG. 6, long-path and short-path slack values are allocated in order to determine minimum and maximum delay budgets. At 601, long-path timing analysis is performed based on temporary delays that satisfy long-path and short-path timing constraints determined at 506. Long-path slack values are generated for each connection as shown in FIG. 8(*d*).

At 602, long-path slack values are allocated as shown in FIG. 8(*e*). Long-path slack values may be allocated by adding delay to temporary delays based on long-path slack values and connection weightings. For connection 821, long-path slack value is allocated by adding a positive long-path slack value of the connection, 5 ns, multiplied by its connection weighting, 1, divided by the largest path weight through the connection, 2, to a temporary delay associated with the connection, 2.5 ns. Notice by using the largest path weight of all paths passing through the connection in the denominator, (positive) slack will never be over-allocated. A larger number in the denominator may be used if the number needs to be approximated. Convergence may be hindered but it is important that (positive) slack not be over-allocated or the algorithm will diverge. The sum, 5 ns, is designated as a temporary maximum delay budget and the adjusted temporary delay for connection 821. For connection 822, long-path slack value is allocated by adding a positive long-path slack value of the connection, 5 ns, multiplied by its connection weighting, 1, divided by the largest path weight through the connection, 2, to a temporary delay associated with the connection, 2.5 ns. The sum, 5 ns, is designated as a temporary maximum delay budget and the adjusted temporary delay for connection 822. For connection 823, long-path slack value is allocated by adding a positive long-path slack value of the connection, 16.5 ns, multiplied by its connection weighting, 1, divided by the largest path weight through the connection, 2, to a temporary delay associated with the connection, 1 ns. The sum, 9.25 ns, is designated as a temporary maximum delay budget and the adjusted temporary delay for connection 823.

At 603, short-path timing analysis is performed based on the temporary delays from 602 as shown in FIG. 8(*f*). Short-path slack values 5 ns, 5 ns, and 12.25 ns are generated for connections 821–823 respectively. The short-path slack values may be generated using the technique described with reference to 502 shown in FIG. 5.

At 604, short-path slack values are allocated as shown in FIG. 8(*g*). Short-path slack values may be allocated by subtracting delays from temporary delays based on short-path slack values and connection weightings. For connection 821, short-path slack values may be allocated by subtracting a positive short-path slack value of the connection, 5 ns, multiplied by its connection weighting, 1, divided by the maximum path weight of all paths through the connection, 2, from a temporary delay associated with the connection, 5 ns. The difference, 2.5 ns, is designated as a temporary minimum delay budget and the adjusted temporary delay for connection 821. For connection 822, short-path slack values may be allocated by subtracting a positive short-path slack value of the connection, 5 ns, multiplied by its connection weighting, 1, divided by the maximum path weight of all paths through the connection, 2, from a temporary delay associated with the connection, 5 ns. The difference, 2.5 ns, is designated as a temporary minimum delay budget and the adjusted temporary delay for connection 822. For connection 823, short-path slack values may be allocated by subtracting a positive short-path slack value of the connection, 12.25 ns, multiplied by its connection weighting, 1, divided by the maximum path weight of all paths through the connection, 2, from a temporary delay associated with the connection, 9.25 ns. The difference, 3.125 ns, is designated as a temporary minimum delay budget and the adjusted temporary delay for connection 823.

At 605, it is determined whether M number of iterations of 601–604 have been performed. In this example, M equals 2 and control returns to 601. It should be noted that these iterations are attempting to maximize the delay budget window sizes.

Figure 8H:
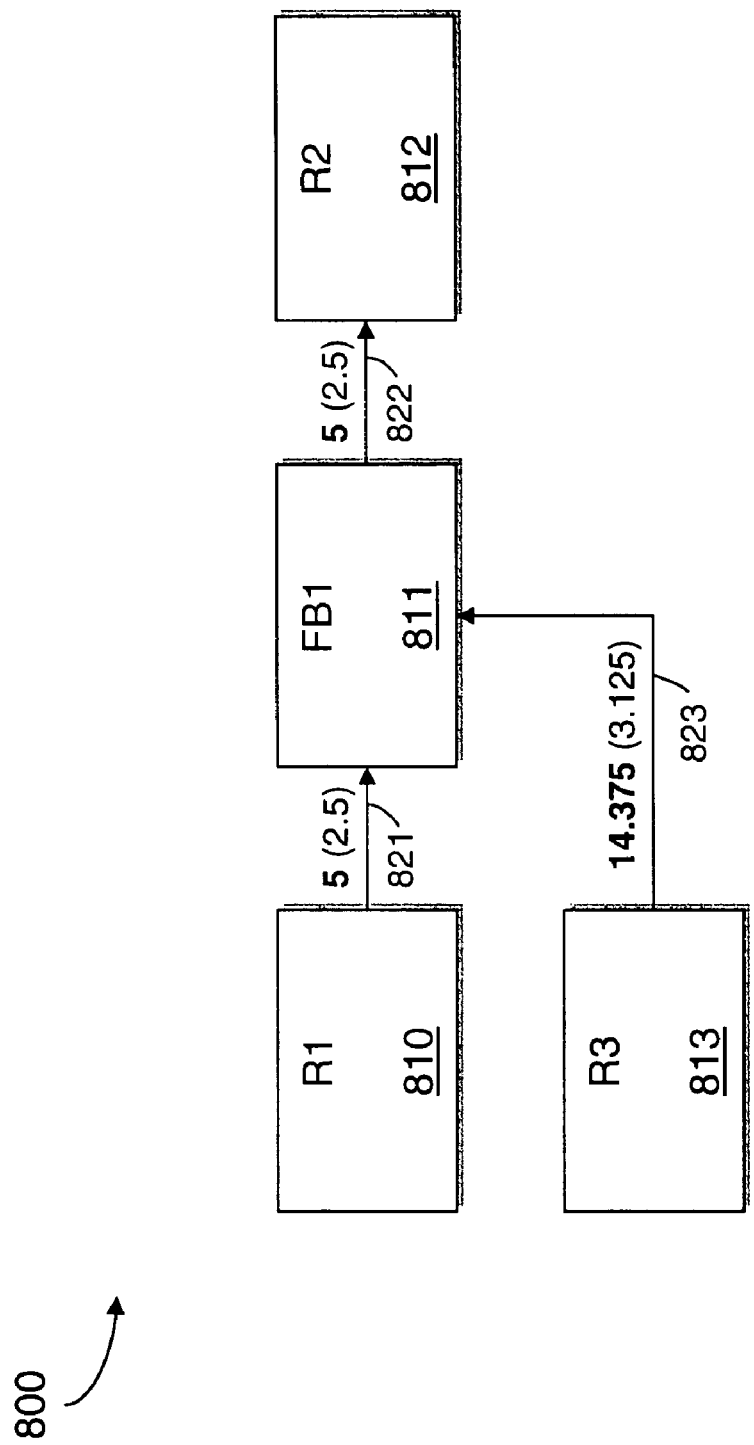

At 601, long-path timing analysis is performed based on the current temporary delays, from 605. Long-path slack values are generated for each connection as shown in FIG. 8(h). The long-path slack values 5 ns, 5 ns, and 14.375 ns are generated for connections 821–823 respectively.

Figure 8I:
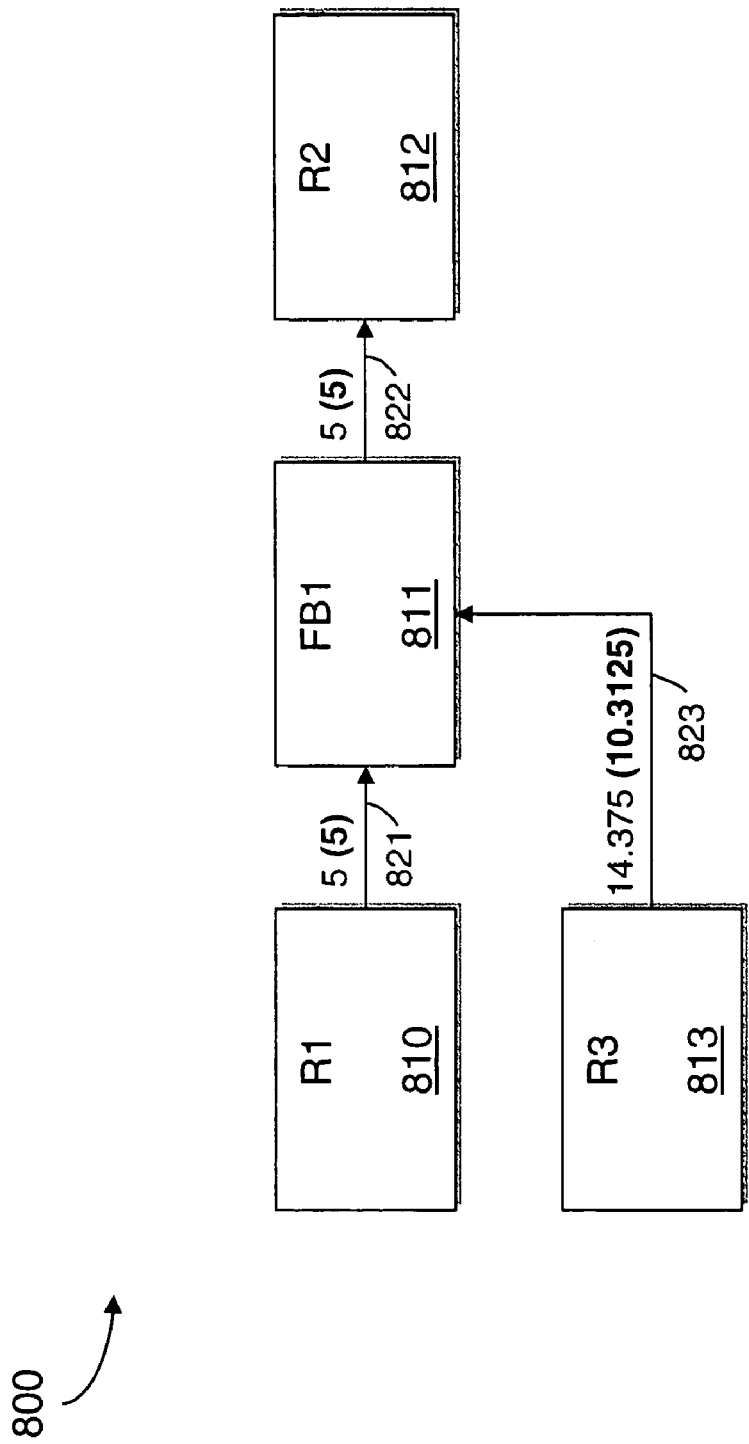

At 602, long-path slack values are allocated as shown in FIG. 8(i). For connection 821, long-path slack value is allocated by adding a positive long-path slack value of the connection, 5 ns, multiplied by its connection weighting, 1, divided by the largest path weight of all paths through the connection, 2, to a temporary delay associated with the connection, 2.5 ns. The sum, 5 ns, is designated as a temporary maximum delay budget and the adjusted temporary delay for connection 821. For connection 822, long-path slack value is allocated by adding a positive long-path slack value of the connection, 5 ns, multiplied by its connection weighting, 1, divided by the largest path weight of all paths through the connection, 2, to a temporary delay associated with the connection, 2.5 ns. The sum, 5 ns, is designated as a temporary maximum delay budget and the adjusted temporary delay for connection 822. For connection 823, long-path slack value is allocated by adding a positive long-path slack value of the connection, 14.375 ns, multiplied by its connection weighting, 1, divided by the largest path weight of all paths through the connection, 2, to a temporary delay associated with the connection, 3.125 ns. The sum, 10.3125 ns, is designated as a temporary maximum delay budget and the adjusted temporary delay for connection 823.

Figure 8J:
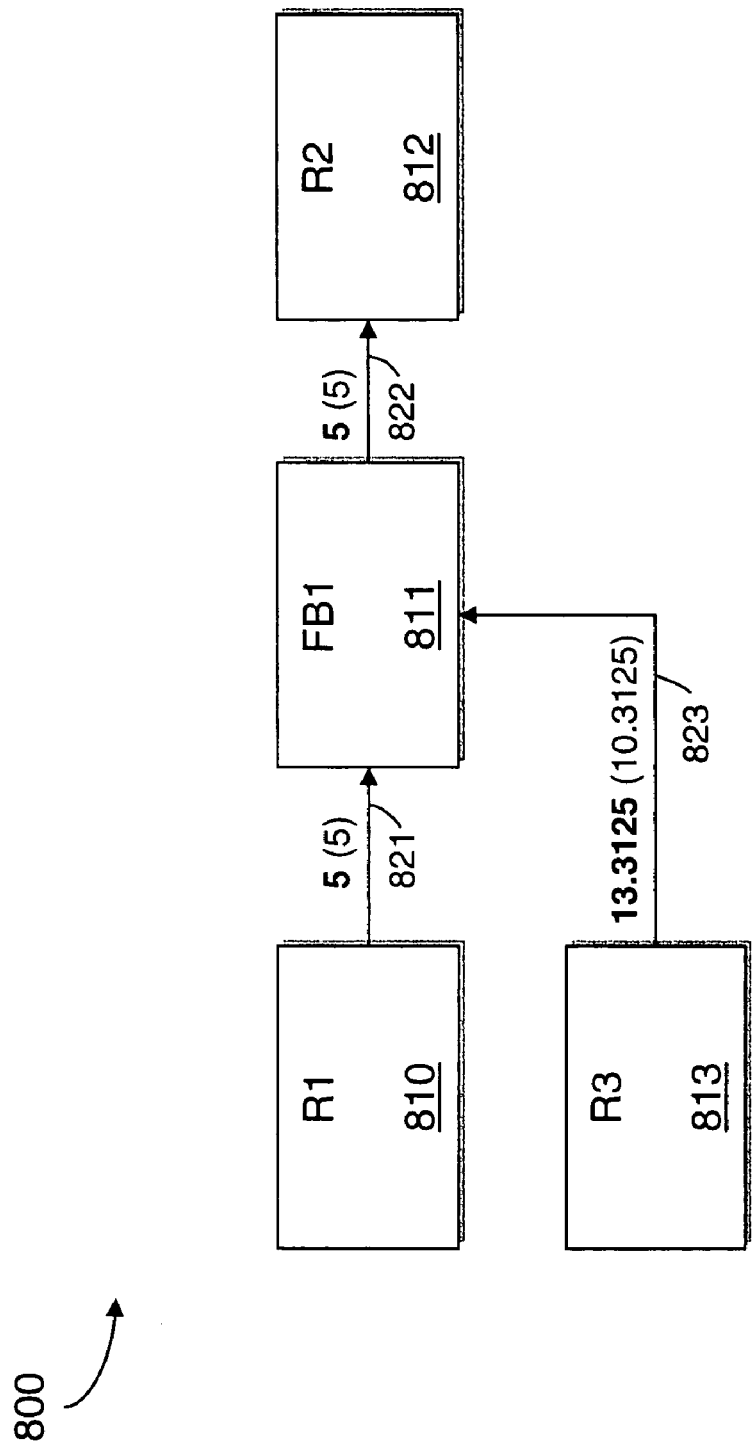

At 603, short-path timing analysis is performed based on the temporary delays from 602 as shown in FIG. 8(j). Short-path slack values 5 ns, 5 ns, and 13.3125 ns are generated for connections 821–823 respectively.

Figure 8K:
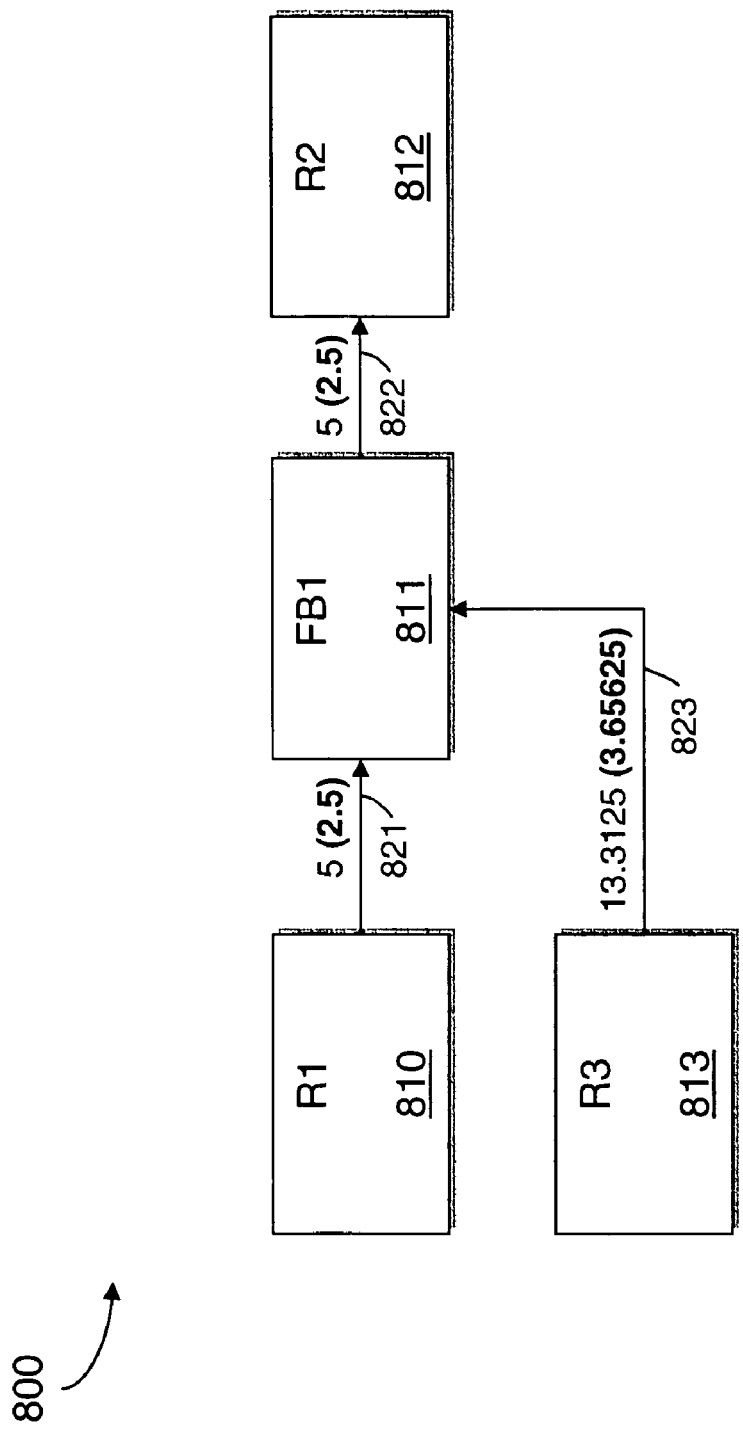

At 604, short-path slack values are allocated as shown in FIG. 8(k). For connection 821, short-path slack values may be allocated by subtracting a positive short-path slack value of the connection, 5 ns, multiplied by its connection weighting, 1, divided by the largest path weight of all paths through the connection, 2, from a temporary delay associated with the connection, 5 ns. The difference, 2.5 ns, is designated as a temporary minimum delay budget and the adjusted temporary delay for connection 821. For connection 822, short-path slack values may be allocated by subtracting a positive short-path slack value of the connection, 5 ns, multiplied by its connection weighting, 1, divided by the largest path weight of all paths through the connection, 2, from a temporary delay associated with the connection, 5 ns. The difference, 2.5 ns, is designated as a temporary minimum delay budget and the adjusted temporary delay for connection 822. For connection 823, short-path slack values may be allocated by subtracting a positive short-path slack value of the connection, 13.3125 ns, multiplied by its connection weighting, 1, divided by the largest path weight of all paths through the connection, 2, from a temporary delay associated with the connection, 10.3125 ns. The difference, 3.65625 ns, is designated as a temporary minimum delay budget and the adjusted temporary delay for connection 823.

At 605, it is determined that a threshold iteration of 2 has been met.

At 606, the temporary maximum and minimum delay budgets for the connections are designated as the maximum and minimum delay budgets for the connections.

The techniques above have been described with reference to designing a programmable logic device. It should be appreciated that the techniques (for synthesis, placement, routing, etc.) may be used in any EDA tool for the creation/processing/optimization/implementation of any electronic design, such as that encountered in the creation of application specific integrated circuits (ASICs) for example, etc.

Embodiments of the present invention (e.g. exemplary process described with respect to FIGS. 4 and 5) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system, comprising:
generating minimum delay budgets for connections from short-path timing constraints, wherein generating the minimum delay budgets for connections comprises allocation of positive and negative slack using successive-over-relaxation where more slack than is available is allocated; and
designing the system in response to the minimum delay budgets.

2. The method of claim 1, wherein allocation of positive and negative slack using successive-over-relaxation comprises:
performing short-path timing analysis to determine short-path slack values; and
allocating the short-path slack values determined by the short-path timing analysis.

3. The method of claim 1, wherein allocation of positive and negative slack using successive-over-relaxation occurs in response to short-path slack values, connection weightings, and a multiplier indicating how much over-allocation should take place.

4. A method for designing a system, comprising:
generating maximum delay budgets for connections from long-path timing constraints, wherein generating the maximum delay budgets for connections comprises allocation of positive and negative slack using successive-over-relaxation where more slack than is available is allocated; and
designing the system in response to the maximum delay budgets.

5. The method of claim 4, wherein allocation of positive and negative slack using successive-over-relaxation comprises:
performing long-path timing analysis to determine long-path slack values; and
allocating the long-path slack values determined by the long-path timing analysis.

6. The method of claim 4, wherein allocation of positive and negative slack using successive-over-relaxation occurs in response to long-path slack values, connection weightings, and a multiplier indicating how much over-allocation should take place.

7. A method for designing a system, comprising:
generating minimum and maximum delay budgets for connections from long-path and short-path timing constraints, wherein for each connection the minimum and maximum delay budgets are determined such that at least one of the minimum delay budgets and maximum delay budgets is determined with consideration of the other; and
designing the system in response to the minimum and maximum delay budgets.

8. The method of claim 7, wherein generating the minimum and maximum delay budgets for connections comprises finding a set of connection delays that attempt to satisfy the short-path and long-path timing constraints.

9. The method of claim 8, wherein generating the minimum and maximum delay budgets for connections further comprises allocating short-path and long-path slack.

10. The method of claim 9, wherein allocating the long-path and short-path slack comprises:
performing long-path timing analysis to determine long-path slack values;
allocating the long-path slack values determined by the long-path timing analysis;
performing short-path timing analysis to determine short-path slack values; and
allocating the short-path slack values determined by the short-path timing analysis.

11. The method of claim 10, wherein allocating the short-path slack values comprises subtracting delay from temporary delays in response to the short-path slack values and connection weightings.

12. The method of claim 10, wherein allocating the long-path slack values comprises adding delay to temporary delays in response to the long-path slack values and connection weightings.

13. The method of claim 12, wherein the connection weightings are determined by a unit weighting scheme.

14. The method of claim 12, wherein the connection weightings are determined based on how much delay can be added before a practical limit is reached or before all relevant slack is allocated.

15. The method of claim 10, wherein the maximum delay budgets are determined from the allocation of the long-path slack values.

16. The method of claim 10, wherein the minimum delay budgets are determined from the allocation of the short-path slack values.

17. The method of claim 10, wherein the method iterates between performing short-path timing analysis and allocating short-path slack values, and performing long-path timing analysis and allocating long-path slack values, to re-generate minimum and maximum delay budgets, respectively.

18. The method of claim 8, wherein finding a set of connection delays that attempt to satisfy the short-path and long-path timing constraints comprises:
performing short-path timing analysis to determine short-path slack values;
fixing any short-path timing constraint violations determined by the short-path timing analysis;
performing long-path timing analysis to determine long-path slack values; and
fixing any long-path timing constraint violations determined by the long-path timing analysis.

19. The method of claim 18, wherein fixing any short-path violations comprises adding delay in response to the short-path slack values and connection weightings.

20. The method of claim 18, wherein fixing any long-path violations comprises subtracting delay in response to the long-path slack values and connection weightings.

21. The method of claim 20, wherein the connection weightings are determined by a unit weighting scheme.

22. The method of claim 20, wherein the connection weightings are determined based on how much delay can be subtracted before a practical limit is reached or all relevant violations are resolved.

23. The method of claim 7, wherein, for each connection, a maximum delay budget generated is greater or equal to a minimum delay budget determined for a respective connection.

24. The method of claim 7, wherein, the method attempts to optimize some function of a distance between minimum and maximum connection delay budgets.

25. The method of claim 7, wherein designing the system in response to the maximum and minimum delay budgets comprises generating a synthesis strategy.

26. The method of claim 25, wherein generating the synthesis strategy comprises determining whether to add or remove levels of logic.

27. The method of claim 25, wherein generating the synthesis strategy comprises determining whether to use slower or faster variants of a functional block.

28. The method of claim 25, wherein generating the synthesis strategy comprises determining whether to use faster or slower logic structures.

29. The method of claim 25, wherein generating the synthesis strategy comprises determining whether to use faster or slower logic inputs.

30. The method of claim 25, wherein generating the synthesis strategy comprises determining whether dedicated routing resources should be used or avoided.

31. The method of claim 7, wherein designing the system in response to the maximum and minimum delay budgets comprises generating a placement strategy.

32. The method of claim 31, wherein generating the placement strategy comprises determining how to place functional blocks so that dedicated routing resources are used or avoided.

33. The method of claim 31, wherein generating the placement strategy comprises determining whether to place a first functional block closer or further apart from a second functional block.

34. The method of claim 31, wherein generating the placement strategy comprises determining how to place two functional blocks to increase or decrease the routing delay between them.

35. The method of claim 7, wherein designing the system in response to the maximum and minimum delay budgets comprises generating a routing strategy.

36. The method of claim 35, wherein generating the routing strategy comprises determining whether to use more or fewer routing resources.

37. The method of claim 35, wherein generating the routing strategy comprises determining whether to use slower or faster routing resources.

38. The method of claim 35, wherein generating the routing strategy comprises determining whether to use buffers to slow down or speed up routes.

39. The method of claim 7, wherein generating the maximum delay budgets for connections comprises generating lower and upper limits on connection delay.

40. The method of claim 7, wherein generating the minimum delay budgets for connections comprises generating lower and upper limits on connection delay.

41. A machine-readable medium having stored thereon sequences of instructions, the sequences of instructions including instructions which, when executed by a processor, causes the processor to perform:

generating minimum and maximum delay budgets for connections from long-path and short-path timing constraints, wherein for each connection the minimum and maximum delay budgets are determined such that at least one of the minimum delay budgets and maximum delay budgets is determined with consideration of the other; and designing a system in response to the minimum and maximum delay budgets.

42. The machine-readable medium of claim 41, wherein generating the minimum and maximum delay budgets for connections comprises finding a set of connection delays that attempt to satisfy the short-path and long-path timing constraints.

43. The machine-readable medium of claim 42, wherein finding a set of connection delays that attempt to satisfy the short-path and long-path timing constraints comprises:

performing short-path timing analysis to determine short-path slack values;

fixing any short-path timing constraint violations determined by the short-path timing analysis;

performing long-path timing analysis to determine long-path slack values; and fixing any long-path timing constraint violations determined by the long-path timing analysis.

44. The machine-readable medium of claim 43, wherein fixing any short-path violations comprises adding delay in response to the short-path slack values and connection weightings.

45. The machine-readable medium of claim 43, wherein fixing any long-path violations comprises subtracting delay in response to the long-path slack values and connection weightings.

46. The machine-readable medium of claim 41, wherein generating the minimum and maximum delay budgets for connections, in part, involves allocating short-path and long-path slack.

47. The machine-readable medium of claim 46, wherein allocating the long-path and short-path slack comprises:

performing long-path timing analysis to determine long-path slack values;

allocating the long-path slack values determined by the long-path timing analysis;

performing short-path timing analysis to determine short-path slack values; and allocating the short-path slack values determined by the short-path timing analysis.

48. The machine-readable medium of claim 47, wherein allocating the long-path slack values comprises adding delay to temporary delays in response to the long-path slack values and connection weightings.

49. The machine-readable medium of claim 47, wherein allocating the short-path slack values comprises subtracting delay from temporary delays in response to the short-path slack values and connection weightings.

\* \* \* \* \*